United States Patent
Damy et al.

(10) Patent No.: US 12,212,307 B2
(45) Date of Patent: Jan. 28, 2025

(54) RECONFIGURABLE FILTER

(71) Applicant: RF360 SINGAPORE PTE. LTD, Singapore (SG)

(72) Inventors: Jacques-Antoine Damy, Nice (FR); Aymen Oueslati, Biot (FR); Charles Binninger, Antibes (FR); Mikko Kaltiokallio, Espoo (FI)

(73) Assignee: RF360 Singapore Pte. Ltd., Republic Plaza (SG)

( * ) Notice: Subject to any disclaimer, the term of this patent is extended or adjusted under 35 U.S.C. 154(b) by 329 days.

(21) Appl. No.: 17/656,847

(22) Filed: Mar. 28, 2022

(65) Prior Publication Data
US 2023/0318574 A1  Oct. 5, 2023

(51) Int. Cl.
H03H 9/64 (2006.01)
(52) U.S. Cl.
CPC ........ *H03H 9/6433* (2013.01); *H03H 9/6406* (2013.01)
(58) Field of Classification Search
CPC .... H03H 9/6433; H03H 9/6406; H03H 9/605; H03H 9/6436; H03H 9/0542; H03H 9/6403; H03H 9/725; H03H 9/6483; H03H 9/568
See application file for complete search history.

(56) References Cited

U.S. PATENT DOCUMENTS

| | | |
|---|---|---|
| 2017/0331458 A1 | 11/2017 | Tomita et al. |
| 2019/0267970 A1 | 8/2019 | Nosaka |
| 2019/0280669 A1* | 9/2019 | Mori .................. H04B 1/50 |
| 2020/0153413 A1* | 5/2020 | Mori .................. H03H 9/605 |
| 2020/0195230 A1 | 6/2020 | Nosaka |
| 2020/0244251 A1 | 7/2020 | Tomita et al. |
| 2020/0366273 A1 | 11/2020 | Nosaka |
| 2021/0194459 A1 | 6/2021 | Alavi et al. |

OTHER PUBLICATIONS

Partial International Search Report—PCT/EP2023/054566—ISA/EPO—Jun. 1, 2023, 14 pages.
International Search Report and Written Opinion—PCT/EP2023/054566—ISA/EPO—Aug. 31, 2023, 22 pages.

* cited by examiner

*Primary Examiner* — John W Poos
(74) *Attorney, Agent, or Firm* — Loza & Loza LLP

(57) ABSTRACT

An apparatus is disclosed for a reconfigurable filter. In example aspects, the apparatus includes a filter circuit that has a first filter port and a second filter port. The filter circuit includes a filter network, an acoustic resonator, and a switch circuit. The filter network includes one or more acoustic resonators coupled between the first filter port and the second filter port. The acoustic resonator is coupled to the filter network and coupled between the first filter port and the second filter port. The switch circuit is coupled between the acoustic resonator and the second filter port, and the switch circuit is configured to connect the acoustic resonator into a parallel acoustic resonator arrangement in a first state and connect the acoustic resonator into a serial acoustic resonator arrangement in a second state.

22 Claims, 12 Drawing Sheets

800 

802
Propagate a signal between a first filter port and a second filter port through an acoustic resonator that is connected to the second filter port in a series acoustic resonator arrangement

804
Disconnect the acoustic resonator from the second filter port

806
Connect the acoustic resonator to a ground in a parallel acoustic resonator arrangement

808
Propagate another signal between the first filter port and the second filter port across the acoustic resonator that is connected to the ground

FIG. 8

RECONFIGURABLE FILTER

TECHNICAL FIELD

This disclosure relates generally to signal communication or signal processing using an electronic device and, more specifically, to employing a reconfigurable filter for signal communication or processing.

BACKGROUND

Electronic devices include traditional computing devices such as desktop computers, notebook computers, smartphones, wearable devices like a smartwatch, internet servers, and so forth. Electronic devices also include other types of computing devices such as personal voice assistants (e.g., smart speakers), wireless access points or routers, thermostats and other automated controllers, robotics, automotive electronics, devices embedded in other machines like refrigerators and industrial tools, Internet of Things (IoT) devices, medical devices, and so forth. These various electronic devices provide services relating to productivity, communication, social interaction, security, health and safety, remote management, entertainment, transportation, and information dissemination. Thus, electronic devices play crucial roles in vital aspects of modern society.

Many of the services provided by electronic devices in today's interconnected world depend at least partly on electronic communications. Electronic communications can include, for example, those exchanged between two or more electronic devices using wireless or wired signals that are transmitted over one or more networks, such as the Internet, a Wi-Fi® network, or a cellular network. Electronic communications can therefore include wireless or wired transmissions and receptions. To make such electronic communications, an electronic device can use a transceiver, such as a wireless transceiver that is designed for wireless communications.

Electronic communications can be realized by propagating signals between two wireless transceivers at two different electronic devices. For example, using a wireless transmitter, a smartphone can transmit a wireless signal to a base station over the air as part of an uplink communication to support mobile services. Using a wireless receiver, the smartphone can receive a wireless signal that is transmitted from the base station via the air medium as part of a downlink communication to enable mobile services. With a smartphone, mobile services can include making voice and video calls, participating in social media interactions, sending messages, watching movies, sharing videos, performing searches, acquiring map information or navigational instructions, finding friends, engaging in location-based services generally, transferring money, obtaining another service like a car ride, and so forth.

Many of these mobile services depend at least partly on the transmission or reception of wireless signals between two or more electronic devices. Consequently, researchers, electrical engineers, and designers of electronic devices strive to develop wireless transceivers that can use wireless signals effectively to provide these and other mobile services.

SUMMARY

A wireless transceiver or a radio-frequency (RF) front-end can include a filter that passes the desired frequencies of a signal but suppresses the undesired ones. Some filters use acoustic resonators that can correspond to particular frequency bands. Each acoustic resonator has an associated financial and size cost. In some acoustic filters, a given acoustic resonator may be capable of being selectively employed for a particular frequency band but not for another band. This means that the acoustic resonator is idle and "wasted" while communicating on the other band. In contrast, described implementations use a given acoustic resonator with at least two different frequency bands with a reconfigurable filter. A reconfigurable filter can include an acoustic filter coupled between first and second filter ports. The reconfigurable filter can also include a switch coupled between the acoustic resonator and the second filter port. The switch enables a terminal of the acoustic resonator to be selectively connected to a ground or the second filter port. If the terminal is connected to the ground, the acoustic resonator operates as a parallel resonator for one frequency band. If the terminal is connected to the second filter port, the acoustic resonator operates as a serial resonator for another frequency band. In these manners, a reconfigurable filter can operate a single acoustic resonator in two frequency bands to reduce costs and save space.

In an example aspect, an apparatus for filtering a signal is disclosed. The apparatus includes a filter circuit. The filter circuit includes a first filter port and a second filter port. The filter circuit also includes a filter network, an acoustic resonator, and a switch circuit. The filter network includes one or more acoustic resonators coupled between the first filter port and the second filter port. The acoustic resonator is coupled to the filter network and is coupled between the first filter port and the second filter port. The switch circuit is coupled between the acoustic resonator and the second filter port. The switch circuit is configured to connect the acoustic resonator into a parallel acoustic resonator arrangement in a first state and connect the acoustic resonator into a serial acoustic resonator arrangement in a second state.

In an example aspect, an apparatus for filtering a signal is disclosed. The apparatus includes a filter circuit. The filter circuit includes a first filter port and a second filter port. The filter circuit also includes an acoustic resonator coupled to the first filter port. The filter circuit further includes a switch coupled between the acoustic resonator and a ground and between the acoustic resonator and the second filter port.

In an example aspect, an apparatus for filtering signals is disclosed. The apparatus includes a filter circuit. The filter circuit includes a first filter port and a second filter port. The filter circuit also includes an acoustic resonator coupled between the first filter port and the second filter port. The filter circuit further includes means for switching the acoustic resonator to be selectively connected to a ground or to the second filter port.

In an example aspect, a method for filtering signals or operating a filter circuit is disclosed. The method includes propagating a signal between a first filter port and a second filter port through an acoustic resonator that is connected to the second filter port in a serial acoustic resonator arrangement. The method also includes disconnecting the acoustic resonator from the second filter port. The method additionally includes connecting the acoustic resonator to a ground in a parallel acoustic resonator arrangement. The method further includes propagating another signal between the first filter port and the second filter port across the acoustic resonator that is connected to the ground.

BRIEF DESCRIPTION OF DRAWINGS

FIG. 2-1 is a schematic diagram illustrating an example transceiver and radio-frequency (RF) front-end that can each include at least one filter circuit.

FIG. 2-2 is a schematic diagram illustrating an example RF front-end (RFFE) that can include one or more filter circuits coupled between at least one antenna and one or more amplifiers.

FIG. 4-1 is a schematic diagram illustrating the reconfigurable filter circuit of FIG. 4 in accordance with an example parallel acoustic resonator mode in which the switch connects the acoustic resonator to the ground.

FIG. 4-2 is a schematic diagram illustrating the reconfigurable filter circuit of FIG. 4 in accordance with an example serial acoustic resonator mode in which the switch connects the acoustic resonator to the filter port.

FIG. 8 is a flow diagram illustrating an example process for operating a reconfigurable filter.

DETAILED DESCRIPTION

Figure 1:
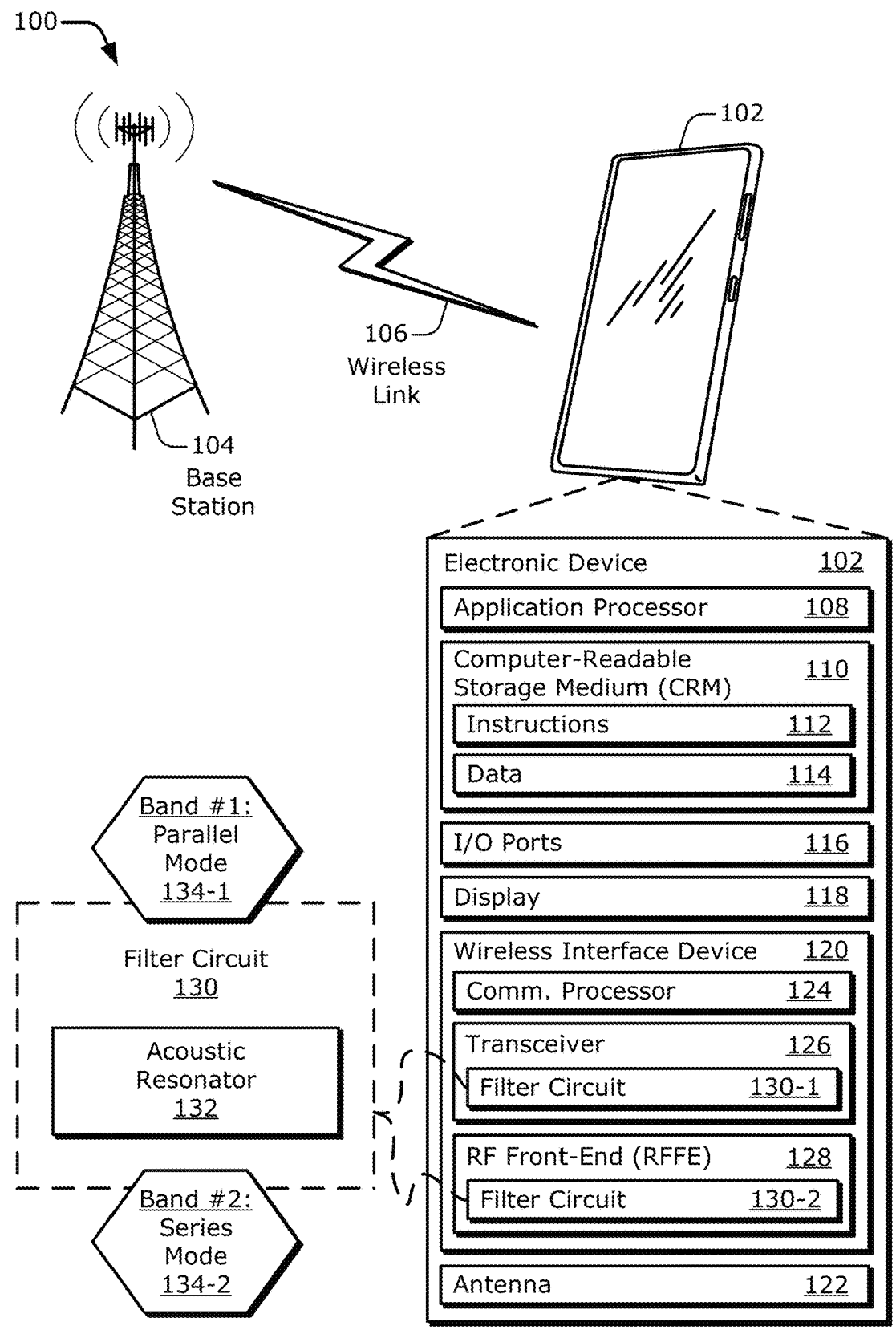
FIG. 1 illustrates an environment with an example electronic device that has a wireless interface device, which includes at least one filter circuit.

To facilitate transmission and reception of wireless signals, an electronic device can use a wireless interface device that includes a wireless transceiver and/or a radio-frequency (RF) front-end. Electronic devices communicate with wireless signals using electromagnetic (EM) signals in various frequencies that exist on a portion of the EM spectrum. These wireless signals may travel between two electronic devices at a particular frequency, such as a kilohertz (kHz) frequency, a megahertz (MHz) frequency, or a gigahertz (GHz) frequency. The EM spectrum is, however, a finite resource that limits how many signals can be simultaneously communicated in any given spatial area. There are already billions of electronic devices that use this limited resource. To enable more simultaneous communications using EM signaling, the finite EM spectrum can be shared among electronic devices. The EM spectrum can be shared using, for instance, frequency division duplexing (FDD) and/or time division duplexing (TDD) techniques.

Techniques for FDD can entail separating the EM spectrum into different frequency bands and constraining communications to occur within an assigned frequency band. Signals in different frequency bands can be communicated at the same time in a same area without significantly interfering with each other. To transmit a signal within a target frequency band, a transmitter can apply a filter to the signal. The filter passes the frequencies of the target frequency band and suppresses (e.g., attenuates, reduces, or blocks) other frequencies. Although filters support FDD techniques to facilitate efficient use of the EM spectrum, filters can create difficulties with electronic devices that communicate wirelessly, e.g., in terms of cost or size increases of the electronic devices.

A wireless transceiver or an RF front-end of an electronic device can include a filter that passes the desired frequencies of a signal but suppresses the undesired ones. Some filters use acoustic resonators, like a bulk acoustic wave (BAW) resonator or a surface acoustic wave (SAW) resonator, to filter frequencies using a piezoelectric material. Each acoustic resonator may be associated with a resonant frequency that corresponds to which frequency or frequencies can be passed or suppressed using the acoustic resonator. Some filters use multiple acoustic resonators to achieve a desired filter response, and some devices have multiple instances of such filters to enable communication across different frequency bands. Consequently, an electronic device can include numerous acoustic resonators.

Each acoustic resonator has an associated financial cost in terms of components and manufacturing efforts. Each acoustic resonator also has a corresponding spatial cost in terms of a size that occupies a volume within a housing of an electronic device. Expense or size may be particularly relevant characteristics for price-sensitive or mobile devices. Reducing a quantity of acoustic resonators employed within an electronic device can therefore lower the financial cost and enable an electronic device to have a smaller form factor.

With various acoustic filter designs, each acoustic resonator may be used in a serial arrangement or in a parallel arrangement. In a serial acoustic resonator arrangement, a filter can propagate a signal through the acoustic resonator from a first terminal to a second terminal thereof to establish or contribute to a passband for a desired frequency. In a parallel acoustic resonator arrangement, a filter can propagate a signal across a terminal of the acoustic resonator with another terminal thereof coupled to ground to shunt certain frequencies to the ground and thereby suppress undesired frequencies.

In some acoustic filters, a given acoustic resonator may be capable of being selectively employed for a particular frequency band but not for another band. For example, the acoustic resonator may be connected as part of a filter for use in a serial or parallel arrangement for transmitting or receiving a signal in the frequency band. If the filter is used for another band, however, the acoustic resonator is disconnected from other components of the filter. In such cases, this acoustic resonator is used for one band but not for the other band. This means that the acoustic resonator is idle, and in a sense "wasted," while the electronic device is communicating in the other band.

In contrast with that approach, some described implementations use a given acoustic resonator with two or more different frequency bands as part of a reconfigurable filter. The acoustic resonator in such a reconfigurable filter need not be idle in any of the two or more frequency bands. Thus, a reconfigurable filter can service multiple frequency bands with fewer acoustic resonators, which reduces financial costs and saves space within the device. In one example realization, a size of the filtering circuitry for two bands can be reduced by at least 20% using the reconfigurable filter techniques described herein. A reconfigurable filter can be used as part of a transmit chain, part of a receive chain, or part of both a transmit chain and a receive chain in a TDD manner using switches. Additionally, or alternatively, a reconfigurable filter as described herein may be used in other parts of an electronic device.

In example implementations, a reconfigurable filter circuit includes an acoustic resonator coupled between a first filter port and a second filter port. The reconfigurable filter circuit also includes a switch coupled between the acoustic resonator and the second filter port. The switch enables a terminal of the acoustic resonator to be selectively connected to a ground or to the second filter port. If the terminal is connected to the ground, the acoustic resonator operates as a parallel resonator for one frequency band. If the terminal of the acoustic resonator is connected to the second filter port, the acoustic resonator operates as a serial resonator for another frequency band. In these manners, a reconfigurable filter circuit can operate a single acoustic resonator in two different modes to service two frequency bands to reduce costs and save space. In some cases, the reconfigurable filter circuit can operate the single acoustic resonator in a parallel mode for a first band and in a serial mode for a second band.

FIG. 1 illustrates an example environment 100 with an electronic device 102 that has a wireless interface device 120, which includes at least one filter circuit 130. This document describes example implementations of the filter circuit 130, which may be part of a transceiver, a radio-frequency front-end (RFFE), and so forth. In the environment 100, the example electronic device 102 communicates with a base station 104 through a wireless link 106. In FIG. 1, the electronic device 102 is depicted as a smartphone. The electronic device 102, however, may be implemented as any suitable computing or other electronic device. Examples of an apparatus that can be realized as an electronic device 102 include a cellular base station, broadband router, access point, cellular or mobile phone, gaming device, navigation device, media device, laptop computer, desktop computer, tablet computer, server computer, network-attached storage (NAS) device, smart appliance, vehicle-based communication system, Internet of Things (IoT) device, sensor or security device, asset tracker, fitness management device, wearable device such as intelligent glasses or smartwatch, wireless power device (transmitter or receiver), medical device, and so forth.

The base station 104 communicates with the electronic device 102 via the wireless link 106, which may be implemented as any suitable type of wireless link that carries a communication signal. Although depicted as a base station tower of a cellular radio network, the base station 104 may represent or be implemented as another device, such as a satellite, terrestrial broadcast tower, access point, peer-to-peer device, mesh network node, fiber optic line interface, another electronic device as described above generally, and so forth. Hence, the wireless link 106 can extend between the electronic device 102 and the base station 104 in some manner.

The wireless link 106 can include a downlink of data or control information communicated from the base station 104 to the electronic device 102. The wireless link 106 can also include an uplink of other data or control information communicated from the electronic device 102 to the base station 104. The wireless link 106 may be implemented using any suitable wireless communication protocol or standard. Examples of such protocols and standards include a 3rd Generation Partnership Project (3GPP) Long-Term Evolution (LTE) standard, such as a 4th Generation (4G) or a 5th Generation (5G) cellular standard: an IEEE 802.11 standard, such as 802.11g, ac, ax, ad, aj, or ay standard (e.g., Wi-Fi®) 6 or WiGig®): an IEEE 802.16 standard (e.g., WiMAX®): a Bluetooth® standard: an ultra-wideband (UWB) standard (e.g., IEEE 802.15.4); and so forth. In some implementations, the wireless link 106 may provide power wirelessly, and the electronic device 102 or the base station 104 may comprise a power source.

As shown for some implementations, the electronic device 102 can include at least one application processor 108 and at least one computer-readable storage medium 110 (CRM 110). The application processor 108 may include any type of processor, such as a central processing unit (CPU) or a multi-core processor, that is configured to execute processor-executable instructions (e.g., code) stored by the CRM 110. The CRM 110 may include any suitable type of data storage media, such as volatile memory (e.g., random-access memory (RAM)), non-volatile memory (e.g., Flash memory), optical media, magnetic media (e.g., disk or tape), and so forth. In the context of this disclosure, the CRM 110 is implemented to store instructions 112, data 114, and other information of the electronic device 102, and thus the CRM 110 does not include transitory propagating signals or carrier waves.

The electronic device 102 may also include one or more input/output ports 116 (I/O ports 116) and at least one display 118. The I/O ports 116 enable data exchanges or interaction with other devices, networks, or users. The I/O ports 116 may include serial ports (e.g., universal serial bus (USB®) ports), parallel ports, audio ports, infrared (IR) ports, cameras, or other sensor ports, and so forth. The display 118 can be realized as a display screen or a projection that presents graphical images provided by other components of the electronic device 102, such as a user interface (UI) associated with an operating system, program, or application. Alternatively, or additionally, the display 118 may be implemented as a display port or virtual interface through which graphical content of the electronic device 102 is communicated or presented.

The electronic device 102 further includes at least one wireless interface device 120 and at least one antenna 122. The example wireless interface device 120 provides connectivity to respective networks and peer devices via a wireless link, which may be configured similarly to or differently from the wireless link 106. The wireless interface device 120 may facilitate communication over any suitable type of wireless network, such as a wireless local area network (LAN) (WLAN), wireless personal-area-network (PAN) (WPAN), peer-to-peer (P2P) network, mesh network, cellular network, wireless wide-area-network (WAN) (WWAN), and/or navigational network (e.g., the Global Positioning System (GPS) of North America or another Satellite Positioning System (SPS) or Global Navigation Satellite System (GNSS)). In the context of the example environment 100, the electronic device 102 can communicate various data and control information bidirectionally with the base station 104 via the wireless interface device 120. The electronic device 102 may, however, communicate directly with other peer devices, an alternative wireless network, and the like. Also, as described above, an electronic device 102 may alternatively be implemented as a base station 104 or another apparatus as set forth herein.

As shown, the wireless interface device 120 can include at least one communication processor 124, at least one transceiver 126, and at least one radio-frequency front-end 128 (RFFE 128). These components process data information, control information, and signals associated with communicating information for the electronic device 102 via the antenna 122. The communication processor 124 may be implemented as at least part of a system-on-chip (SoC), as a modem processor, or as a baseband radio processor (BBP) that enables a digital communication interface for data, voice, messaging, or other applications of the electronic device 102. The communication processor 124 can include a digital signal processor (DSP) or one or more signal-processing blocks (not shown) for encoding and modulating data for transmission and for demodulating and decoding received data. Additionally, the communication processor 124 may also manage (e.g., control or configure) aspects or operation of the transceiver 126, the RF front-end 128, and other components of the wireless interface device 120 to implement various communication protocols or communication techniques.

In some cases, the application processor 108 and the communication processor 124 can be combined into one module or integrated circuit (IC), such as an SoC. Regardless, the application processor 108, the communication processor 124, or a processor generally can be operatively coupled to one or more other components, such as the CRM 110 or the display 118, to enable control of, or other interaction with, the various components of the electronic device 102. For example, at least one processor 108 or 124 can present one or more graphical images on a display screen implementation of the display 118 based on one or more wireless signals transmitted or received via the at least one antenna 122 using components of the wireless interface device 120. Further, the application processor 108 or the communication processor 124, including a combination thereof, can be realized using digital circuitry that implements logic or functionality that is described herein. Additionally, the communication processor 124 may also include or be associated with a memory (not separately depicted) to store data and processor-executable instructions (e.g., code), such as the same or another CRM 110.

As shown, the wireless interface device 120 can include at least one filter circuit 130, which is described below. More specifically, the transceiver 126 can include at least one filter circuit 130-1, or the RF front-end 128 can include at least one filter circuit 130-2 (including both can include at least one filter circuit 130 in accordance with an optional but permitted inclusive-or interpretation of the word "or"). The transceiver 126 can also include circuitry and logic for filtering, switching, amplification, channelization, frequency translation, and so forth. Frequency translation functionality may include an up-conversion or a down-conversion of frequency that is performed through a single conversion operation (e.g., with a direct-conversion architecture) or through multiple conversion operations (e.g., with a super-heterodyne architecture). Generally, the transceiver 126 can include filters, switches, amplifiers, mixers, and so forth for routing and conditioning signals that are transmitted or received via the antenna 122.

In addition to the filter circuit 130-1, the transceiver 126 can include an analog-to-digital converter (ADC) or a digital-to-analog converter (DAC). In operation, an ADC can convert analog signals to digital signals, and a DAC can convert digital signals to analog signals. Generally, an ADC or a DAC can be implemented as part of the communication processor 124, as part of the transceiver 126, or separately from both (e.g., as another part of an SoC or as part of the application processor 108).

Figures 1, 2:
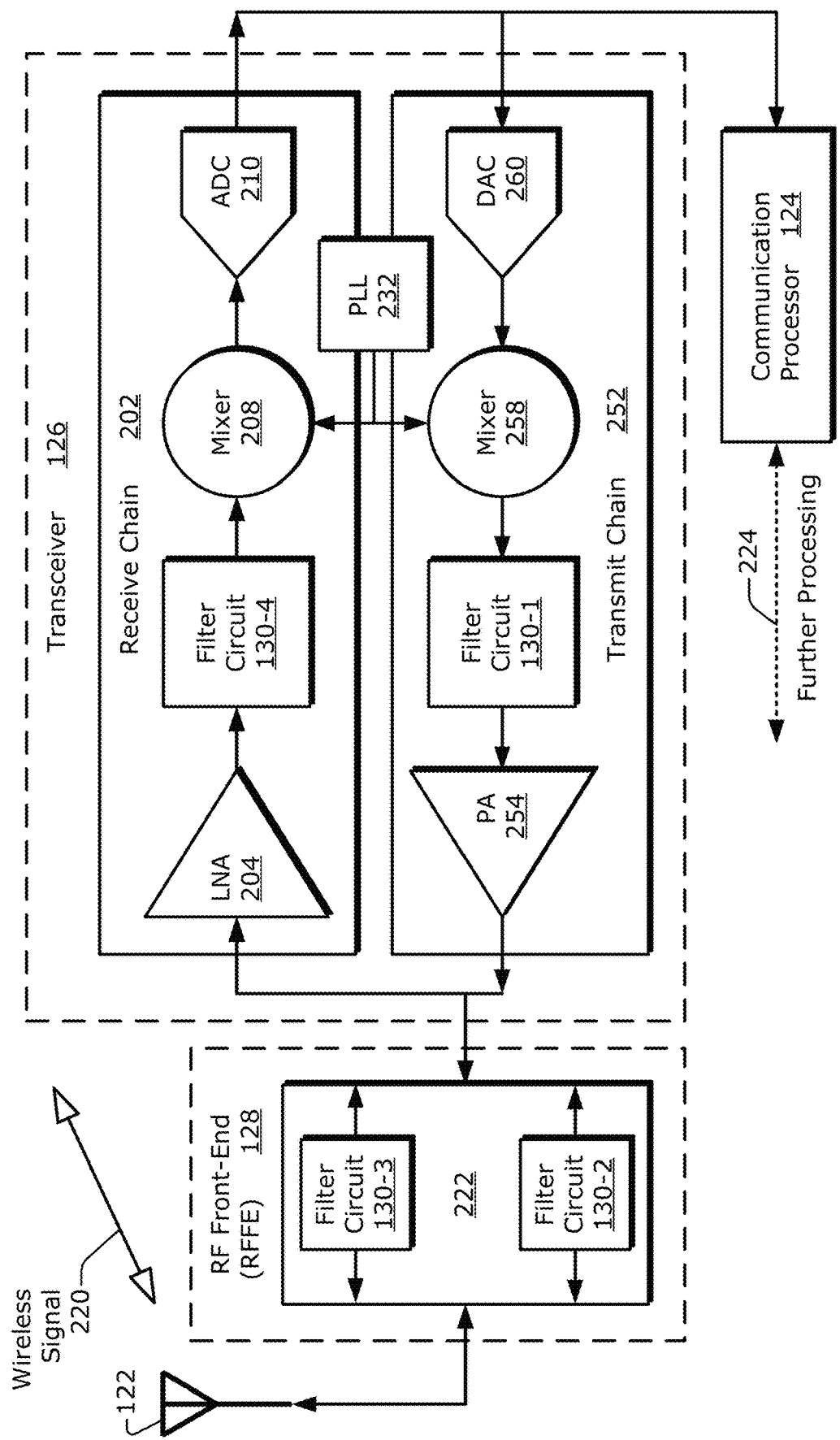
Figure 2:
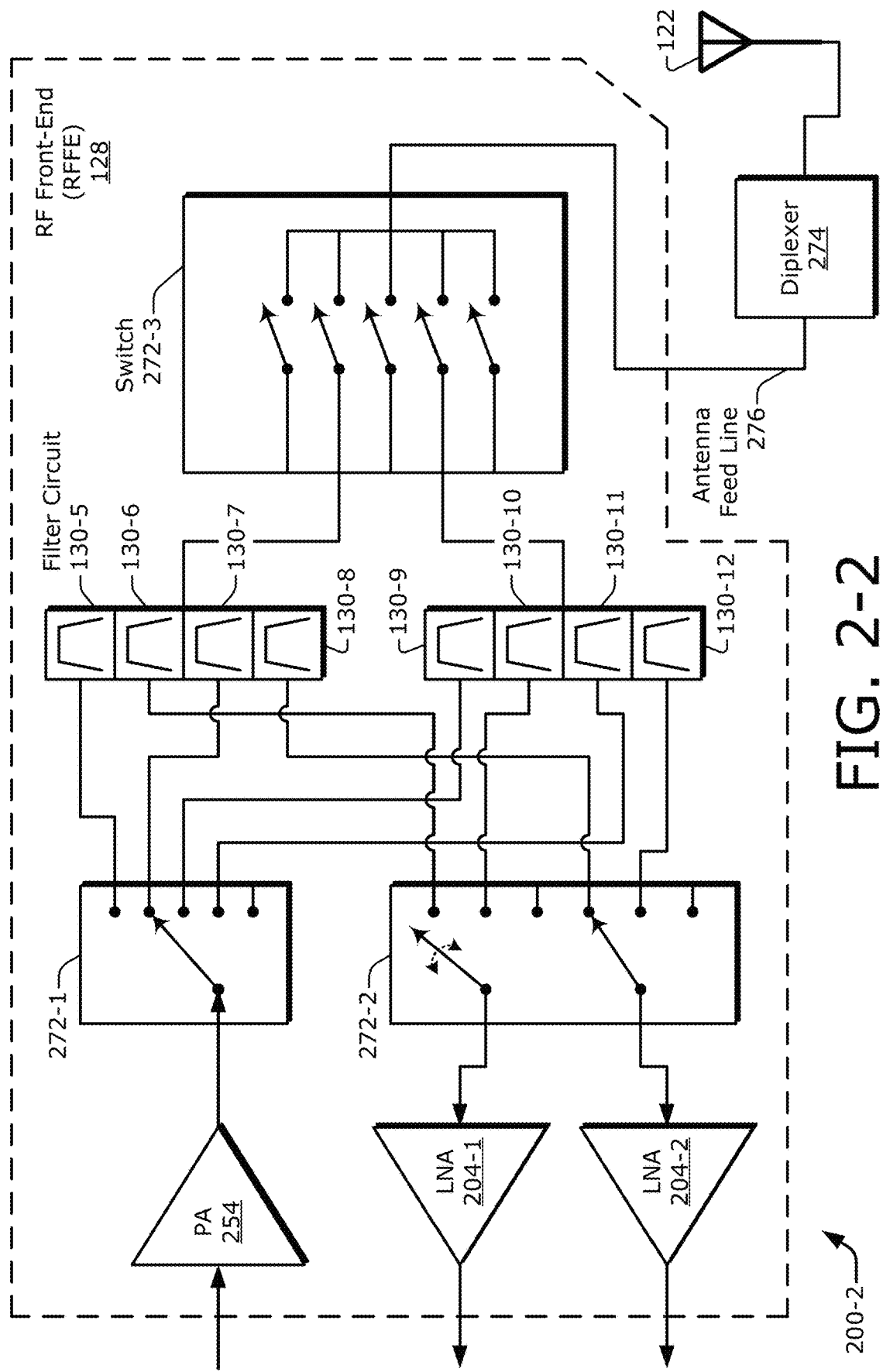

The components or circuitry of the transceiver 126 can be implemented in any suitable fashion, such as with combined transceiver logic or separately as respective transmitter and receiver entities. In some cases, the transceiver 126 is implemented with multiple or different sections to implement respective transmitting and receiving operations (e.g., with separate transmit and receive chains as depicted in FIG. 2). Although not shown in FIG. 1, the transceiver 126 may also include logic to perform in-phase/quadrature (I/Q) operations, such as synthesis, phase correction, modulation, demodulation, and the like.

The RF front-end 128 can include one or more filters-such as the filter circuit 130-2—multiple switches, or one or more amplifiers for conditioning signals received via the antenna 122 or for conditioning signals to be transmitted via the antenna 122. The RF front-end 128 may also include a phase shifter (PS), peak detector, power meter, gain control block, antenna tuning circuit, N-plexer, balun, and the like. Configurable components of the RF front-end 128, such as some phase shifters, an automatic gain controller (AGC), or a reconfigurable version of the filter circuit 130, may be controlled by the communication processor 124 to implement communications in various modes, with different frequency bands, or using beamforming. In some implementations, the antenna 122 is implemented as at least one antenna array that includes multiple antenna elements. Thus, as used herein, an "antenna" can refer to at least one discrete or independent antenna, to at least one antenna array that includes multiple antenna elements, or to a portion of an antenna array (e.g., an antenna element), depending on context or implementation.

In FIG. 1, an example filter circuit 130 is depicted as being part of a transceiver 126 as a filter circuit 130-1, as being part of an RF front-end 128 as a filter circuit 130-2, and so forth. Described implementations of a filter circuit 130 can, however, additionally, or alternatively be employed in other portions of the wireless interface device 120 or in other portions of the electronic device 102 generally. As set forth above, a filter circuit 130 can be included in an electronic device other than a cell phone, such as a base station 104. With a base station, a filter of an intermediate frequency (IF) section of a wireless interface device and/or an RF front-end may include a filter circuit 130 as described herein. Usage within a base station may depend on power levels, operating frequency, and so forth. Other electronic device apparatuses that can employ a filter circuit 130 include a laptop, communication hardware of a vehicle, a wireless access point, and so forth as described herein.

In example implementations, the filter circuit 130 can include at least one acoustic resonator 132. As illustrated, the filter circuit 130 can operate in multiple modes, such as a first mode 134-1 and a second mode 134-2. In some cases, the filter circuit 130 can selectively operate in a parallel mode 134-1 for a first frequency band (band #1) or a serial mode 134-2 for a second frequency band (band #2). Although two modes corresponding to two frequency bands are explicitly depicted in FIG. 1, the filter circuit 130 may operate in fewer or more modes corresponding to fewer or more frequency bands.

By employing the acoustic resonator 132 in multiple modes (e.g., in a parallel acoustic resonator arrangement and in a serial acoustic resonator arrangement) for multiple frequency bands, the filter circuit 130 can include at least one fewer acoustic resonator to cover a same quantity of frequency bands. This can lower costs or reduce a size of a wireless interface device 120 and thus an associated electronic device 102. Example implementations for such filter circuits are described below with reference to FIGS. 3, 4, 4-1, and 4-2. Next, however, this document describes example implementations of a transceiver and an RF front-end with reference to FIGS. 2-1 and 2-2.

FIG. 2-1 is a schematic diagram 200-1 illustrating an example transceiver 126 and an example RF front-end 128, each of which may include at least one filter circuit 130. FIG. 2-1 also depicts an antenna 122 and a communication processor 124. The communication processor 124 communicates one or more data signals to other components, such as the application processor 108 of FIG. 1, for further processing at 224 (e.g., for processing at an application level). As shown, the circuitry 200-1 can include a filter circuit 130-1, a filter circuit 130-2, a filter circuit 130-3, or a filter circuit 130-4, including one to four of such filter circuits. The circuitry 200-1, however, may include a different quantity of filters (e.g., more or fewer), may include filters that are coupled together differently, may include filters in different locations, and so forth.

As illustrated from left to right, in example implementations, the antenna 122 is coupled to the RF front-end 128, and the RF front-end 128 is coupled to the transceiver 126. The transceiver 126 is coupled to the communication processor 124. The example RF front-end 128 includes at least one signal propagation path 222. The at least one signal propagation path 222 can include at least one filter circuit 130, such as the filter circuit 130-2 and the filter circuit 130-3. The example transceiver 126 includes at least one receive chain 202 (or receive path 202) and at least one transmit chain 252 (or transmit path 252). Although only one RF front-end 128, one transceiver 126, and one communication processor 124 are shown at the circuitry 200-1, an electronic device 102, or a wireless interface device 120 thereof, can include multiple instances of any or all such components. Also, although only certain components are explicitly depicted in FIG. 2 and are shown coupled together in a particular manner, the transceiver 126 or the RF front-end 128 may include other non-illustrated components (e.g., switches or diplexers), more or fewer components, differently coupled arrangements of components, and so forth.

In some implementations, the RF front-end 128 couples the antenna 122 to the transceiver 126 via the signal propagation path 222. In operation, the signal propagation path 222 carries a signal between the antenna 122 and the transceiver 126. During or as part of the signal propagation, the signal propagation path 222 conditions the propagating signal, such as with the filter circuit 130-2 or the filter circuit 130-3. This enables the RF front-end 128 to couple a wireless signal 220 from the antenna 122 to the transceiver 126 as part of a reception operation. The RF front-end 128 also enables a transmission signal to be coupled from the transceiver 126 to the antenna 122 as part of a transmission operation to emanate a wireless signal 220. Although not explicitly shown in FIG. 2, an RF front-end 128, or a signal propagation path 222 thereof, may include one or more other components, such as another filter, an amplifier (e.g., a power amplifier or a low-noise amplifier), an N-plexer, a phase shifter, one or more switches and so forth.

In some implementations, the transceiver 126 can include at least one receive chain 202, at least one transmit chain 252, or at least one receive chain 202 and at least one transmit chain 252. From left to right, the receive chain 202 can include a low-noise amplifier 204 (LNA 204), the filter circuit 130-4, a mixer 208 for frequency down-conversion, and an ADC 210. The transmit chain 252 can include a power amplifier 254 (PA 254), the filter circuit 130-1, a mixer 258 for frequency up-conversion, and a DAC 260. However, the receive chain 202 or the transmit chain 252 can include other components—for example, additional amplifiers or filters, multiple mixers, one or more buffers, or at least one local oscillator—that are electrically disposed anywhere along the depicted receive and transmit chains.

The receive chain 202 is coupled between the signal propagation path 222 of the RF front-end 128 and the communication processor 124—e.g., via the low-noise amplifier 204 and the ADC 210, respectively. The transmit chain 252 is coupled between the signal propagation path 222 and the communication processor 124—e.g., via the power amplifier 254 and the DAC 260, respectively. The transceiver 126 can also include at least one phase-locked loop 232 (PLL 232) that is coupled to the mixer 208 or the mixer 258. For example, the transceiver 126 can include one PLL 232 for each transmit/receive chain pair, one PLL 232 per transmit chain and one PLL 232 per receive chain, multiple PLLs 232 per chain, and so forth.

As shown along a signal propagation direction for certain example implementations of the receive chain 202, the antenna 122 is coupled to the low-noise amplifier 204 via the signal propagation path 222 and the filter circuit 130-3 thereof, and the low-noise amplifier 204 is coupled to the filter circuit 130-4. The filter circuit 130-4 is coupled to the mixer 208, and the mixer 208 is coupled to the ADC 210. The ADC 210 is in turn coupled to the communication processor 124. As shown along a signal propagation direction for certain example implementations of the transmit chain 252, the communication processor 124 is coupled to the DAC 260, and the DAC 260 is coupled to the mixer 258. The mixer 258 is coupled to the filter circuit 130-1, and the filter circuit 130-1 is coupled to the power amplifier 254. The power amplifier 254 is coupled to the antenna 122 via the signal propagation path 222 using the filter circuit 130-2 thereof. Although only one receive chain 202 and one transmit chain 252 are explicitly shown, an electronic device 102, or a transceiver 126 thereof, can include multiple instances of either or both components. Although the ADC 210 and the DAC 260 are illustrated as being separately coupled to the communication processor 124, they may share a bus or other means for communicating with the processor 124.

As part of an example signal-receiving operation, the low-noise amplifier 204 provides an amplified signal to the filter circuit 130-4. The filter circuit 130-4 filters the amplified signal and provides a filtered signal to the mixer 208. The mixer 208 performs a frequency conversion operation on the filtered signal to down-convert from one frequency to a lower frequency (e.g., from a radio frequency (RF) to an intermediate frequency (IF) or to a baseband frequency (BBF)). The mixer 208 can perform the frequency down-conversion in a single conversion step or through multiple conversion steps using at least one PLL 232. The mixer 208 can provide a down-converted signal to the ADC 210 for conversion and forwarding to the communication processor 124 as a digital signal.

As part of an example signal-transmitting operation, the mixer 258 accepts an analog signal at BBF or IF from the DAC 260. The mixer 258 upconverts the analog signal to a higher frequency, such as to an RF frequency, to produce an RF signal using a signal generated by the PLL 232 to have a target synthesized frequency. The mixer 258 provides the RF or other upconverted signal to the filter circuit 130-1. The filter circuit 130-1 filters the RF signal and provides a filtered signal to the power amplifier 254. Thus, after filtering by the filter circuit 130-1, the power amplifier 254 provides an amplified signal to the signal propagation path 222 for signal conditioning. The RF front-end 128 can use, for instance, the filter circuit 130-2 of the signal propagation path 222 to provide a filtered signal to the antenna 122 for emanation as a wireless signal 220.

Example implementations of a filter circuit 130, as described herein, may be employed at any one or more of the example filter circuits 130-1, 130-2, 130-3, or 130-4 in the transceiver 126 and the RF front-end 128 or for other filters of an electronic device 102 (not shown in FIG. 2-1). The circuitry 200-1, however, depicts just some examples for a transceiver 126 and/or an RF front-end 128. In some cases, the various components that are illustrated in the drawings using separate schematic blocks or circuit elements may be manufactured or packaged in different discrete manners. For example, one physical module may include components of the RF front-end 128 and some components of the transceiver 126, and another physical module may combine the communication processor 124 with the remaining components of the transceiver 126. Further, in some cases, the antenna 122 may be co-packaged with at least some components of the RF front-end 128 or the transceiver 126. In alternative implementations, one or more components may be physically or logically "shifted" to a different part of the wireless interface device 120 as compared to the illustrated circuitry 200-1 and/or may be incorporated into a different module. For example, a low-noise amplifier 204 or a power amplifier 254 may alternatively or additionally be deployed in the RF front-end 128. Examples of this alternative are described next with reference to FIG. 2-2.

FIG. 2-2 is a schematic diagram 200-2 illustrating an example RF front-end 128 that can include one or more filter circuits coupled between at least one antenna 122 and one or more amplifiers, such as an LNA or a PA. As illustrated, the RF front-end 128 is coupled to the antenna 122 via an antenna feed line 276. Between the RF front-end 128 and the antenna 122, the antenna feed line 276 may include a diplexer 274 (or a duplexer in some implementations where Tx and Rx operations share the antenna 122). The RF front-end 128 can include a power amplifier 254, a first low-noise amplifier 204-1, and a second low-noise amplifier 204-2. The RF front-end 128 can also include multiple switches, such as a first switch 272-1, a second switch 272-2, and a third switch 272-3. The first switch 272-1 is coupled along a transmit path of a signal propagation path 222 (of FIG. 2-1), and the second switch 272-2 is coupled along a receive path of another signal propagation path 222. The third switch 272-3 is coupled along the transmit path and the receive path. Multiple transmit or receive signal propagation paths may be established using the switches.

In example implementations, the RF front-end 128 can further include multiple filter circuits, such as eight filter circuits 130-5 to 130-12. The four filter circuits 130-5, 130-7, 130-9, and 130-11 can be used as part of a transmit path between the power amplifier 254 and the antenna 122, with the transmit path including the antenna feed line 276. The four filter circuits 130-6, 130-8, 130-10, and 130-12 can be used as part of a receive path between the antenna 122 and a low-noise amplifier 204, such as the first low-noise amplifier 204-1 or the second low-noise amplifier 204-2. Thus, the four filter circuits 130-5, 130-7, 130-9, and 130-11 can filter a transmit signal that is output by the power amplifier 254. On the other hand, the four filter circuits 130-6, 130-8, 130-10, and 130-12 can filter a receive signal before the receive signal is input to the first or second low-noise amplifier 204-1 or 204-2.

The transmit and receive paths can be established using one or more of the first, second, or third switches 272-1, 272-2, or 272-3. A controller (not shown in FIG. 2-2), which may be part of the communication processor 124 (of FIGS. 1 and 2-1), can position or set the states of these switches based on transmit versus receive mode, a frequency being used for transmission or reception, and so forth. Although certain components are depicted in FIG. 2-2 in certain arrangements and described above in a particular manner, an RF front-end 128 can include different components, more or fewer components, different couplings or arrangements, and so forth.

Figure 3:
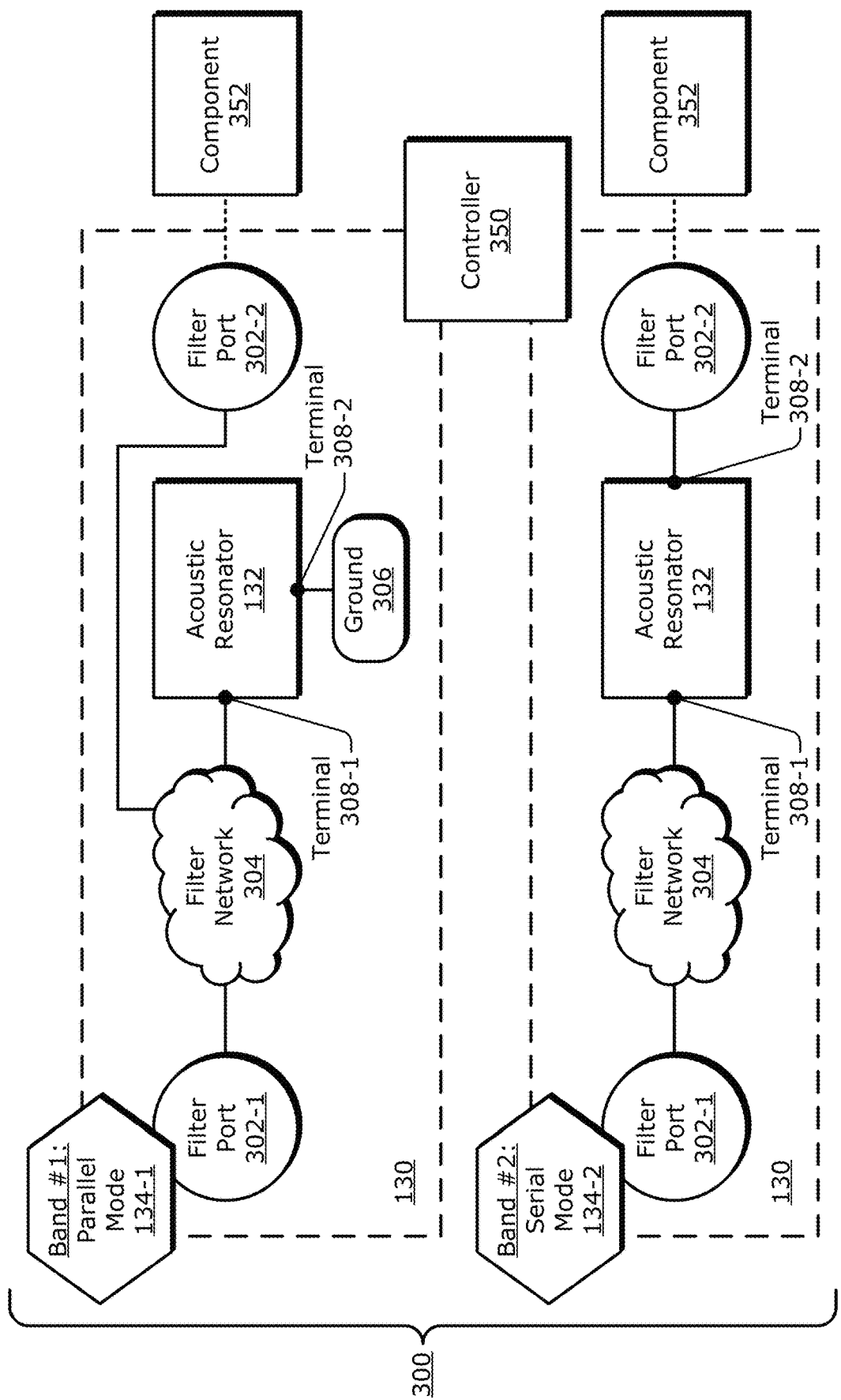
FIG. 3 is a schematic diagram illustrating two example operational modes of an example reconfigurable filter circuit having an acoustic resonator that can be connected in multiple manners.

FIG. 3 is a schematic diagram 300 illustrating two example operational modes 134-1 and 134-2 of an example reconfigurable filter circuit 130 having an acoustic resonator 132 that can be connected in multiple manners. In the upper portion of FIG. 3 (as depicted on the drawing sheet), the filter circuit 130 is operating in an example parallel mode 134-1, which may correspond to a first frequency band (band #1). In the parallel mode 134-1, an acoustic resonator 132 is connected in a parallel acoustic resonator arrangement. In the lower portion of FIG. 3, the filter circuit 130 is operating in an example serial mode 134-2, which may correspond to a second frequency band (band #2). In the serial mode 134-2, the acoustic resonator 132 is connected in a serial acoustic resonator arrangement. These acoustic resonator arrangements are described further below.

Figure 4:
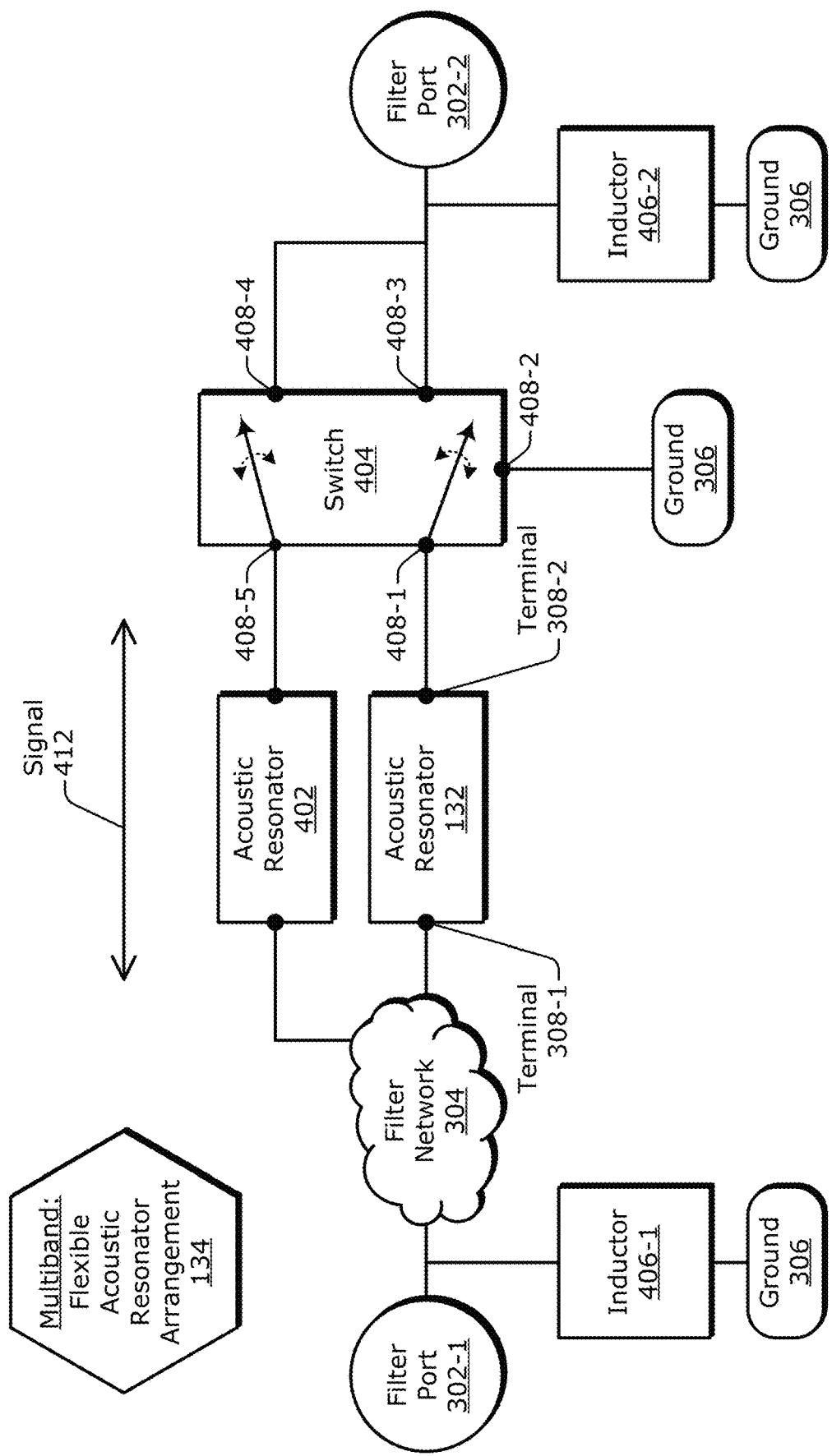
FIG. 4 is a schematic diagram illustrating an example reconfigurable filter circuit including an example switch that is coupled between an acoustic resonator and a ground and between the acoustic resonator and a filter port.
Figures 1, 4:
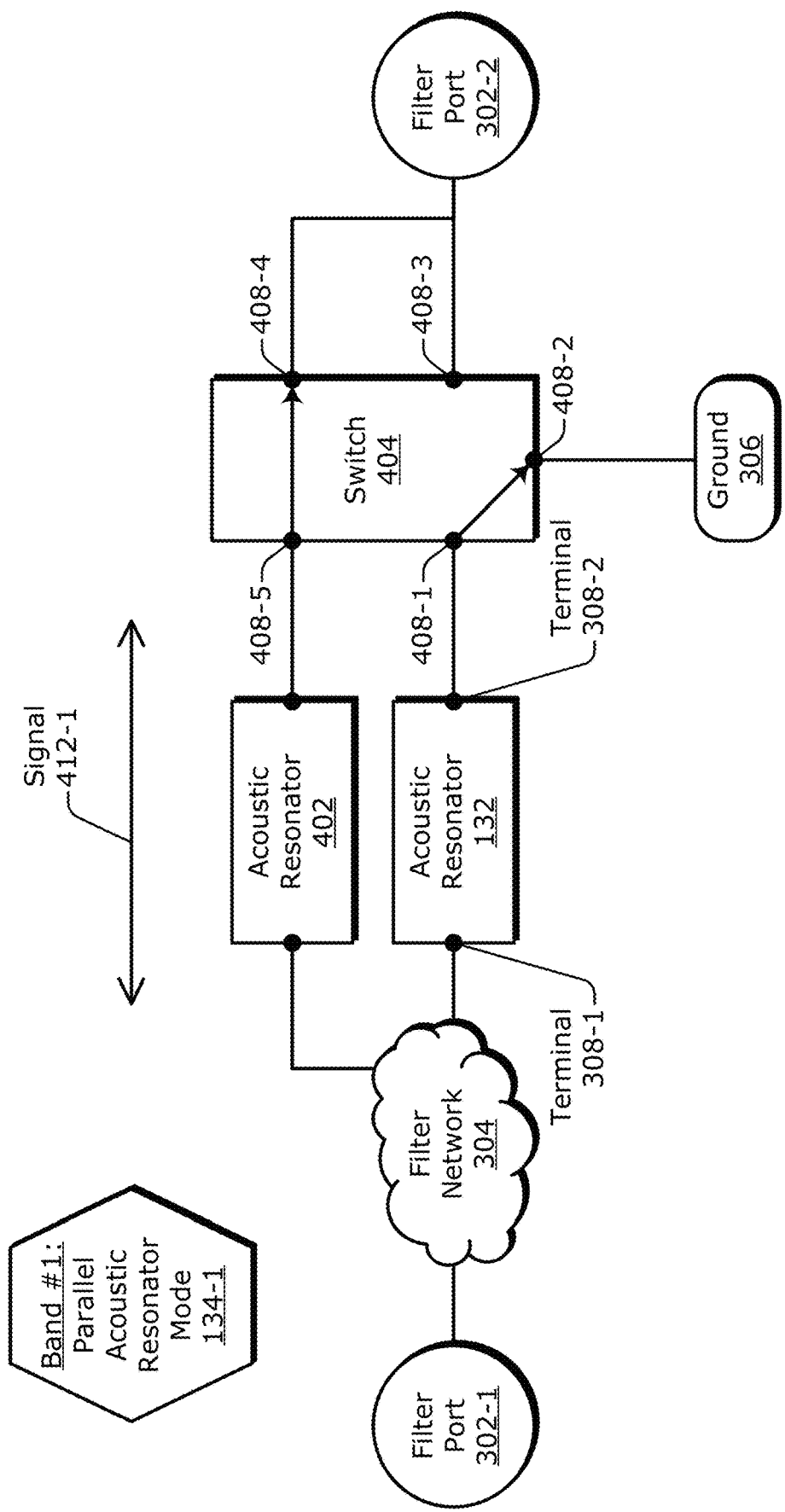
Figures 2, 4:
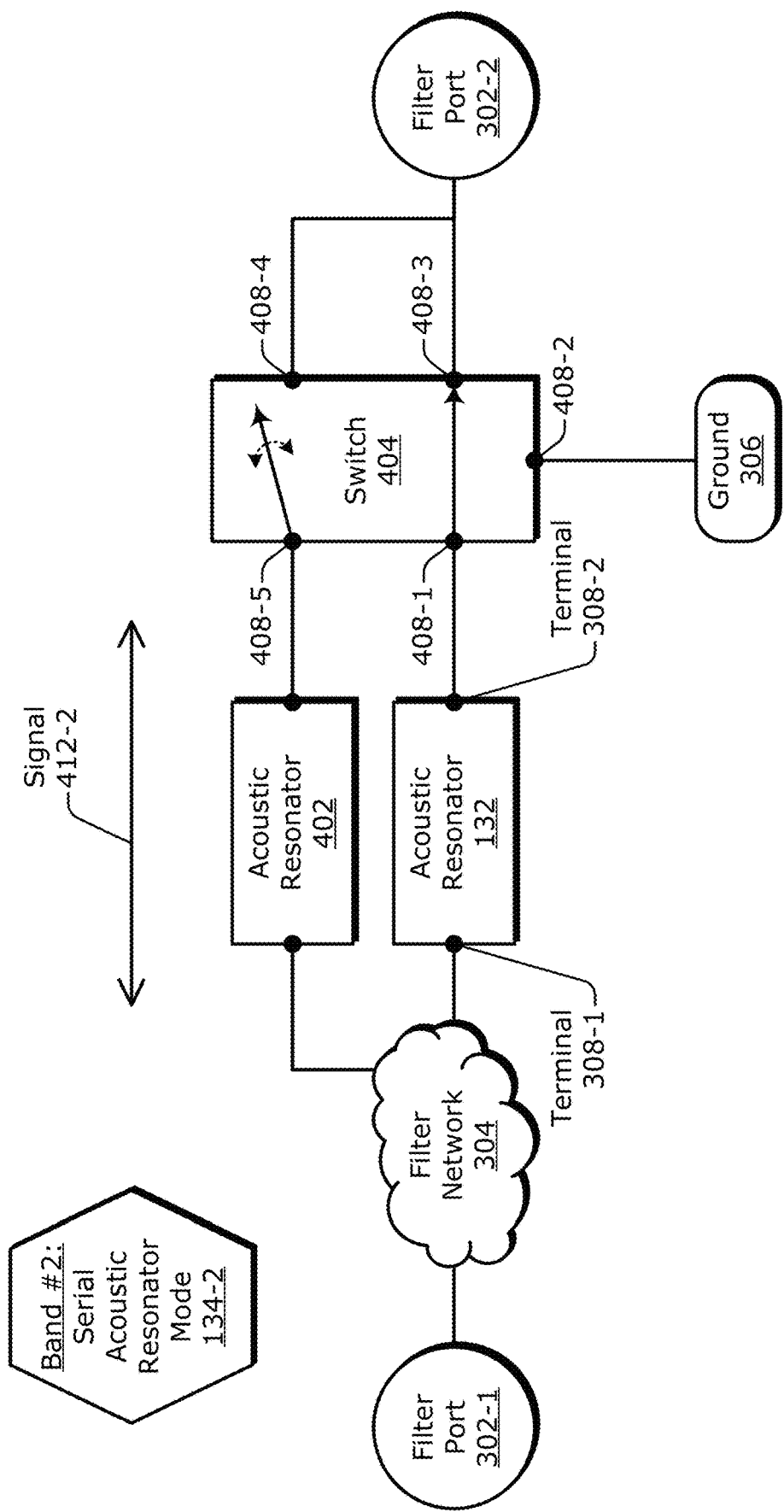

In example implementations, the filter circuit 130 can include multiple filter ports, such as a first filter port 302-1 and a second filter port 302-2: a filter network 304; and the acoustic resonator 132. The filter circuit 130 can also include or otherwise have access to a ground 306. As shown, the filter network 304 can be coupled between the first filter port 302-1 and the second filter port 302-2. The acoustic resonator 132 can be coupled between the filter network 304 and the second filter port 302-2 via, for instance, a switch (e.g., as shown in FIG. 4). Examples of the filter network 304 are described below with reference to FIG. 5. The acoustic resonator 132 includes multiple terminals, such as a first terminal 308-1 and a second terminal 308-2.

The filter circuit 130 can be coupled between two or more components. Thus, each filter port 302 may be coupled to at least one component 352. For example, as shown in FIG. 3, the second filter port 302-2 can be coupled to the component 352. As shown more clearly in FIGS. 2-1 and 2-2, the component 352 may be realized as an amplifier, such as a low-noise amplifier 204 or a power amplifier 254, if the second filter port 302-2 is coupled toward an "internal" side of a communication chain (e.g., a side that is closer to a modem). On the other hand, the component 352 may be realized as an antenna 122 if the second filter port 302-2 is coupled toward an "external" side of a communication chain (e.g., a side that is farther from the modem).

In example operations, a controller 350 can control a mode 134 in which the filter circuit 130 is configured or currently operating. The controller 350 may be part of, for instance, the wireless interface device 120, such as logic positioned at the transceiver 126 or the RF front-end 128. In such cases, the logic may receive a control signal (e.g., a frequency band indication) from the communication processor 124. Additionally, or alternatively, the controller 350 may be part of the communication processor 124 and/or may be distributed across multiple portions of the wireless interface device 120. The communication processor 124 can establish a state (e.g., open, closed, or those terminal(s) that are connected or disconnected) of a switch (e.g., as shown in FIG. 4) responsive to a frequency band for a wireless communication.

The frequency bands may pertain to transmission, reception, or combinations thereof. In an example, the band 12, the band 13, or the band 14 for LTE may correspond to the first frequency band of FIG. 3, which relates to the parallel mode 134-1. The band 29 for LTE may correspond to the second frequency band of FIG. 3, which relates to the serial mode 134-2. The downlink frequency range of band 29 (717-728 MHZ) is located proximate to, and between, the uplink and downlink frequency ranges of band 12 (699-716 and 729-746 MHZ, respectively). Thus, this is an example of a resonant frequency target of an acoustic resonator that may be relevant across multiple bands. Such an acoustic resonator may therefore be usable across multiple bands to reduce a quantity of acoustic resonators that are employed in one or more filters while still serving a same number of bands, which can thereby lower costs and reduce size. A graph that depicts insertion loss versus frequency and includes example frequency response curves targeting these example bands is described below with reference to FIG. 9.

In some implementations, a same acoustic resonator 132 is used across two or more frequency bands by reconfiguring connections of a filter circuit 130. In the parallel mode 134-1, the acoustic resonator 132 is connected in a parallel acoustic resonator arrangement between the filter network 304 and the ground 306. Specifically, the first terminal 308-1 of the acoustic resonator 132 is coupled to the filter network 304, and the second terminal 308-2 of the acoustic resonator 132 is coupled to the ground 306.

In the serial mode 134-2, the acoustic resonator 132 is connected in a serial acoustic resonator arrangement between the filter network 304 and the second filter port 302-2. Specifically, the first terminal 308-1 of the acoustic resonator 132 is coupled to the filter network 304, and the second terminal 308-2 of the acoustic resonator 132 is coupled to the second filter port 302-2. Thus, a same terminal 308 (e.g., the second terminal 308-2) of the acoustic resonator 132 can be selectively connected to the ground 306 or to the second filter port 302-2. This selective connecting or disconnecting can be accomplished using a switch, which is described next with reference to FIGS. 4 to 4-2.

FIG. 4 is a schematic diagram illustrating an example reconfigurable filter circuit 130 including an example switch 404 that is coupled between an acoustic resonator 132 and a ground 306 and between the acoustic resonator 132 and a filter port, such as the second filter port 302-2. FIG. 4 depicts a reconfigurable filter circuit 130 in a general state that illustrates that the filter circuit 130 can be flexibly reconfigured into different acoustic resonator arrangements for different operational modes 134 to support multiple frequency bands. FIG. 4-1 depicts the reconfigurable filter circuit 130 in a parallel acoustic resonator mode 134-1, and FIG. 4-2 depicts the reconfigurable filter circuit 130 in a serial acoustic resonator mode 134-2.

In example implementations, and relative to the schematic diagram of FIG. 3, the filter circuit 130 can additionally include the switch 404, a second acoustic resonator 402, and one or more inductors 406. As shown, a first inductor 406-1 can be coupled between the first filter port 302-1 and the ground 306. A second inductor 406-2 can be coupled between the second filter port 302-2 and the ground 306. The inductors 406 may be omitted. If present, an inductor 406 may be part of the filter circuit 130 or separate from the filter circuit 130.

Like in FIG. 3, the acoustic resonator 132 (or first acoustic resonator 132) can be coupled between the filter network 304 and the second filter port 302-2. Similarly, the second acoustic resonator 402 can be coupled between the filter network 304 and the second filter port 302-2. The switch 404 may be coupled between each of the acoustic resonators and the second filter port 302-2. Thus, the switch 404 can be coupled between the second acoustic resonator 402 and the second filter port 302-2. The switch 404 can also be coupled between the acoustic resonator 132 and the second filter port 302-2 and between the acoustic resonator 132 and the ground 306. The switch 404, which may be realized as a switch circuit, may be built using, for example, one or more transistors that can be turned on or off to act as a switch that is being closed or opened, respectively.

The switch 404 includes multiple terminals. As shown in FIG. 4, the multiple terminals include a first terminal 408-1, a second terminal 408-2, a third terminal 408-3, a fourth terminal 408-4, and a fifth terminal 408-5. A switch 404 may, however, have more or fewer terminals. The first terminal 408-1 is coupled to the acoustic resonator 132 at the second terminal 308-2 thereof. The second terminal 408-2 is coupled to the ground 306. The third terminal 408-3 is coupled to the second filter port 302-2. The fourth terminal 408-4 is also coupled to the second filter port 302-2. The fifth terminal 408-5 is coupled to the second acoustic resonator 402. However, a switch 404, including the terminals thereof, may be coupled to the other components in different manners.

In operation, the filter circuit 130 propagates a signal 412 between the first filter port 302-1 and the second filter port 302-2 in either or both directions. Thus, the filter circuit 130 can operate bidirectionally in a TDD manner. Example signal propagations and signal paths, which may be responsive to a current frequency band, are described next with reference to FIGS. 4-1 and 4-2.

FIG. 4-1 is a schematic diagram illustrating the reconfigurable filter circuit 130 of FIG. 4 in accordance with an example parallel acoustic resonator mode 134-1 in which the switch 404 connects the acoustic resonator 132 to the ground 306 in a first state. In example implementations, the switch 404 connects the acoustic resonator 132 to the ground 306 by establishing a signal path between the first terminal 408-1 and the second terminal 408-2 of the switch 404. The acoustic resonator 132 is therefore configured in a parallel acoustic resonator arrangement. With this parallel resonator arrangement, the acoustic resonator 132 can support a frequency suppression with respect to a propagating signal 412-1. The switch 404 can also connect the second acoustic resonator 402 to the second filter port 302-2 by establishing a signal path between the fourth terminal 408-4 and the fifth terminal 408-5 of the switch 404.

In example operations, the filter circuit 130 can propagate the signal 412-1 across the acoustic resonator 132 via the terminal 308-1 in accordance with the parallel acoustic resonator arrangement. The acoustic resonator 132, based on a resonant frequency thereof and responsive to the frequency of the signal 412-1, may shunt at least certain frequencies to the ground 306 using the signal path established by the switch 404 through the first and second terminals 408-1 and 408-2 thereof. Thus, the acoustic resonator 132 can support a suppression operation in the parallel acoustic resonator mode 134-1. Meanwhile, as part of this mode of operation, the filter circuit 130 can propagate the signal 412-1 through the second acoustic resonator 402 and to the second filter port 302-2 as part of a passband operation using a signal path that excludes the acoustic resonator 132 and that is established, at least partially, by the switch 404 using its fourth and fifth terminals 408-4 and 408-5.

FIG. 4-2 is a schematic diagram illustrating the reconfigurable filter circuit 130 of FIG. 4 in accordance with an example serial acoustic resonator mode 134-2 in which the switch 404 connects the acoustic resonator 132 to the second filter port 302-2 in a second state. In example implementations, the switch 404 connects the acoustic resonator 132 to the second filter port 302-2 by establishing a signal path between the first terminal 408-1 and the third terminal 408-3 of the switch 404. The acoustic resonator 132 is therefore configured in a serial acoustic resonator arrangement. With this serial resonator arrangement, the acoustic resonator 132 can support a frequency passband with respect to another signal 412-2. The switch 404 can also disconnect the second acoustic resonator 402 from the second filter port 302-2 by removing a signal path between the fourth terminal 408-4 and the fifth terminal 408-5 of the switch 404.

In example operations, the filter circuit 130 can propagate the other signal 412-2 through the acoustic resonator 132 via the terminal 308-1 and the terminal 308-2 in accordance with the serial acoustic resonator arrangement. The acoustic resonator 132, based on a resonant frequency thereof and responsive to the frequency of the other signal 412-2, may pass the other signal 412-2 to the second filter port 302-2 for at least certain frequencies thereof using the signal path established by the switch 404 through the first and third terminals 408-1 and 408-3. If the other signal 412-2 is traveling in the opposite direction, the acoustic resonator 132 may pass at least a portion of the other signal 412-2 to the filter network 304. Thus, the acoustic resonator 132 can support a bandpass operation in the serial acoustic resonator mode 134-2. Meanwhile, as part of this mode of operation, the filter circuit 130 can substantially remove the second acoustic resonator 402 from affecting the other signal 412-2 by disconnecting this resonator from the second filter port 302-2 and/or connecting this resonator to an open circuit (not explicitly indicated) at the fourth and fifth terminals 408-4 and 408-5 of the switch 404.

Figure 5:
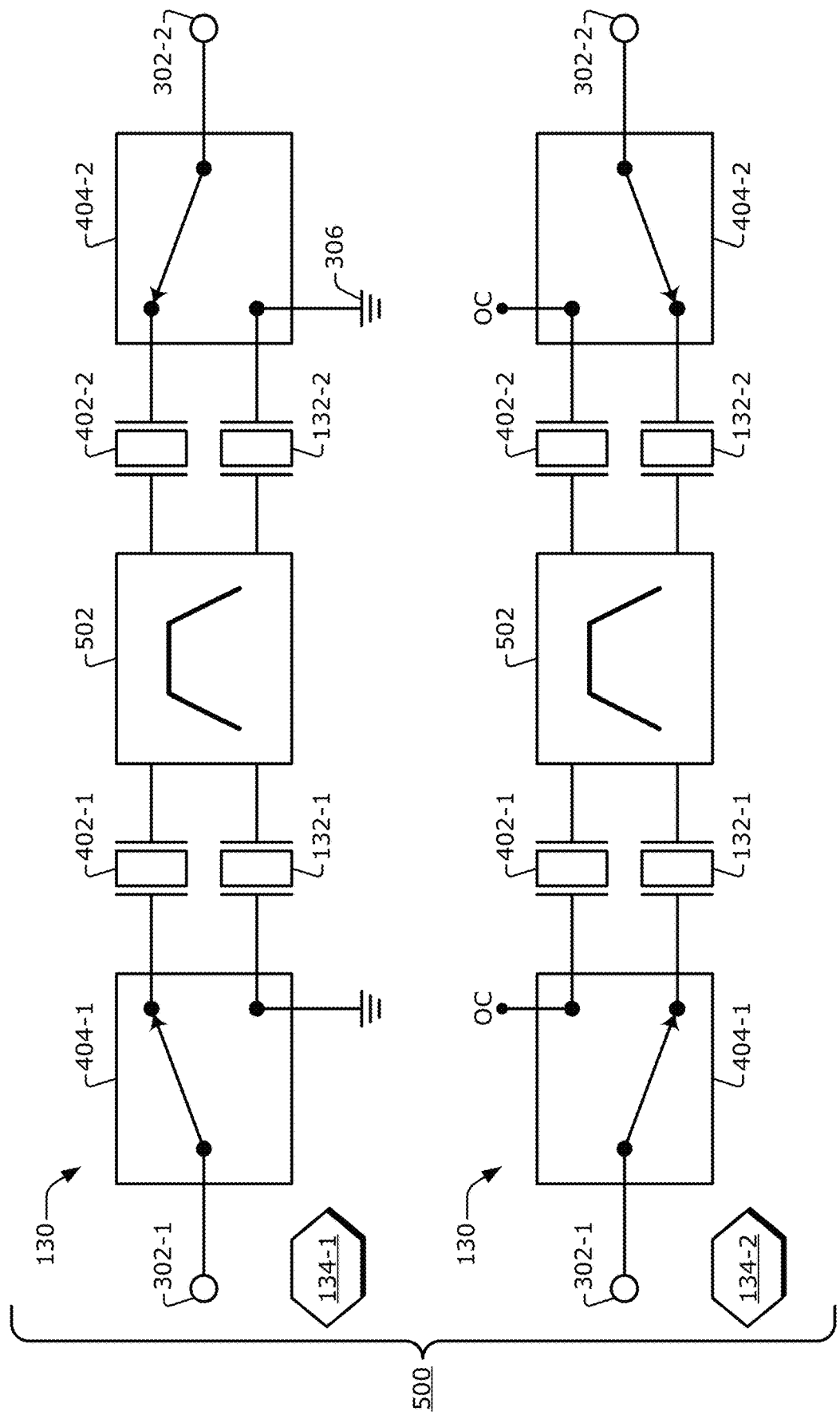
FIG. 5 is a circuit diagram illustrating two example operational modes of an example reconfigurable filter circuit having at least one acoustic resonator that can be connected in multiple manners.

FIG. 5 is a circuit diagram 500 illustrating two example operational modes of an example reconfigurable filter circuit 130 having at least one acoustic resonator 132-2 that can be connected in multiple manners. In these examples, a flexibly coupled acoustic resonator is positioned proximate to the first filter port 302-1 and the second filter port 302-2. In example implementations, the filter circuit 130 includes multiple acoustic resonators, such as a first acoustic resonator 132-2, a second acoustic resonator 402-2, a third acoustic resonator 132-1, and a fourth acoustic resonator 402-1. The filter circuit 130 can also include multiple switches, such as a first switch 404-2 and a second switch 404-1, and at least one filter core 502.

Generally, these components are coupled between the first and second filter ports 302-1 and 302-2. The filter core 502 is coupled between the pairs of acoustic resonators. For instance, the filter core 502 can be coupled between the first and second acoustic resonators 132-2 and 402-2 on one side and the third and fourth acoustic resonators 132-1 and 402-1 on the other side. The first and second acoustic resonators 132-2 and 402-2 are coupled between the filter core 502 and the first switch 404-2. The first switch 404-2 is coupled between the first and second acoustic resonators 132-2 and 402-2 and the second filter port 302-2. The third and fourth acoustic resonators 132-1 and 402-1 are coupled between the second switch 404-1 and the filter core 502. The second switch 404-1 is coupled between the first filter port 302-1 and the third and fourth acoustic resonators 132-1 and 402-1.

In some implementations, the filter network 304 of FIGS. 3 to 4-2 can include the filter core 502 but exclude the third and fourth acoustic resonators 132-1 and 402-1. In other implementations, the filter network 304 can include the filter core 502 and the third and fourth acoustic resonators 132-1 and 402-1, at least relative to the first or second acoustic resonator 132-2 or 402-2. The filter core 502 can include one or more components to provide a filter response. These components can be integrated or discrete, including a combination thereof. The components of the filter core can include inductors and capacitors or at least one acoustic wave filter, including combinations thereof. An acoustic wave filter may include a SAW filter, a BAW filter, and so forth. The acoustic wave filter may be realized as a ladder filter, a bridge filter, and so forth. In some cases, the acoustic wave filter can be implemented with a dual-mode (or double-mode) surface acoustic wave (SAW) (DMS) filter.

In the upper portion (as depicted on the drawing sheet) of FIG. 5, the filter circuit 130 is in a parallel mode 134-1. Using the first switch 404-2 and the second switch 404-1, respectively, the first acoustic resonator 132-2 and the third acoustic resonator 132-1 are configured in a parallel acoustic resonator arrangement in which each resonator is connected between the filter core 502 and the ground 306. To provide a signaling path for the signal being filtered, the first switch 404-2 connects the second acoustic resonator 402-2 between the filter core 502 and the second filter port 302-2. Similarly, the second switch 404-1 connects the fourth acoustic resonator 402-1 between the filter core 502 and the first filter port 302-1.

Responsive to a change in a frequency band for a signal being filtered, a controller (e.g., the controller 350 of FIG. 3) can reconfigure the filter circuit 130. In the lower portion of FIG. 5, the filter circuit 130 is a serial mode 134-2. To configure this mode, the first switch 404-2 disconnects the first acoustic resonator 132-2 from the ground 306 and connects the first acoustic resonator 132-2 to the second filter port 302-2. The first switch 404-2 also disconnects the second acoustic resonator 402-2 from the second filter port 302-2. The first switch 404-2 may further connect the second acoustic resonator 402-2 to an open circuit. At the other filter port, the second switch 404-1 disconnects the third acoustic resonator 132-1 from the ground 306 and connects the third acoustic resonator 132-1 to the first filter port 302-1. The second switch 404-1 also disconnects the fourth acoustic resonator 402-1 from the first filter port 302-1. The second switch 404-1 may further connect the fourth acoustic resonator 402-1 to an open circuit.

Figure 6:
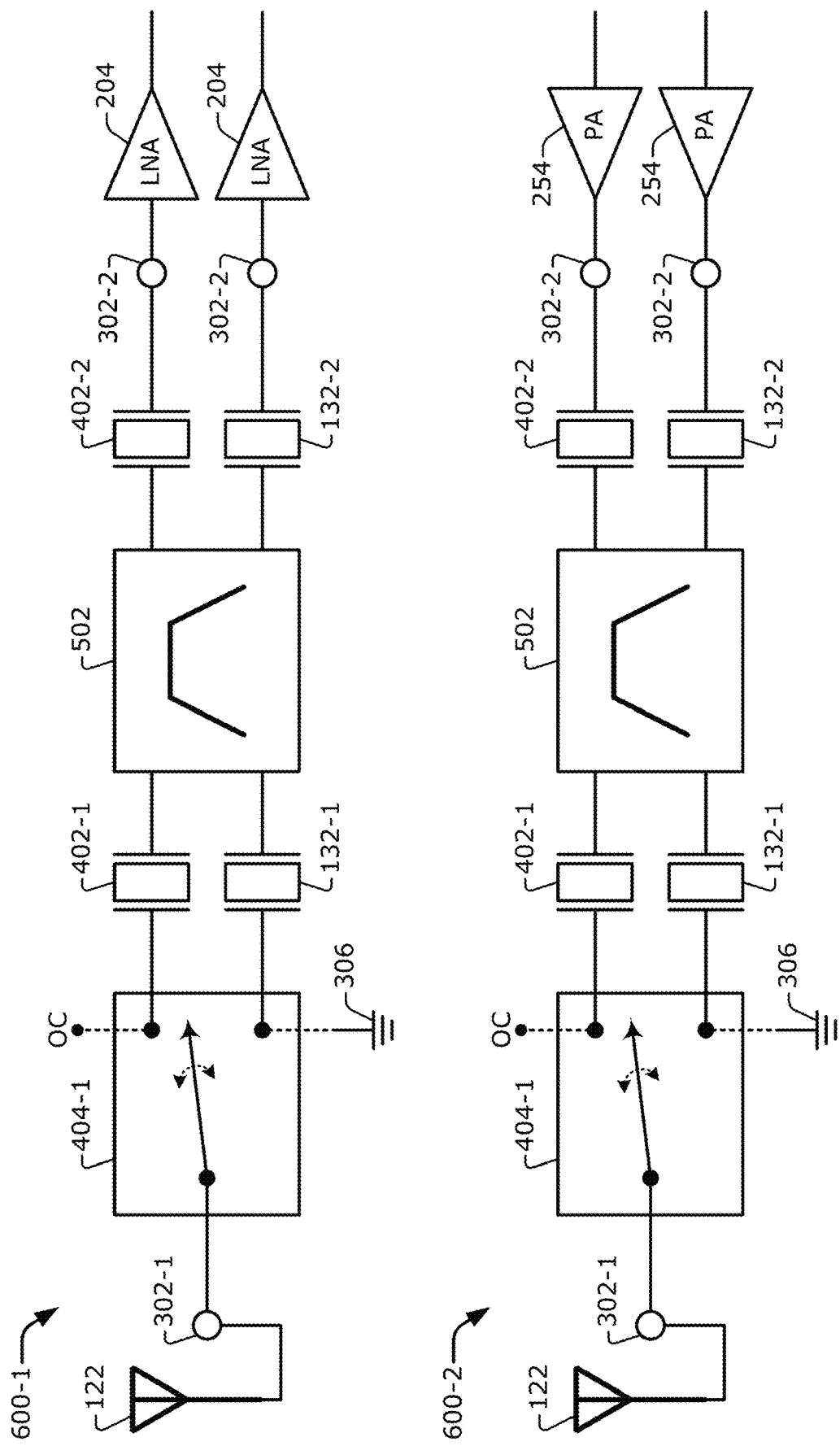
FIG. 6 are circuit diagrams illustrating example first and second signal processing chains including an antenna on one side and amplifiers on the other side of each respective processing chain.

FIG. 6 has circuit diagrams illustrating example first and second signal processing chains 600-1 and 600-2 including an antenna 122 on one side and multiple amplifiers on the other side of each respective processing chain 600. In these examples, a flexibly coupled acoustic resonator is included on one side. The antenna 122 is coupled to the first filter port 302-1. Using the second switch 404-1, the fourth acoustic resonator 402-1 can be connected to the first filter port 302-1 or disconnected to create an open circuit. The third acoustic resonator 132-1 can be connected to the first filter port 302-1 to establish a serial acoustic resonator arrangement or connected to the ground 306 to establish a parallel acoustic resonator arrangement with respect to the first filter port 302-1.

On the other side of each signal processing chain, a flexibly coupled acoustic resonator is omitted. Instead, each of the two acoustic resonators is coupled to a respective amplifier. In the first signal processing chain 600-1, each acoustic resonator 132-2 and 402-2 is coupled to a respective low-noise amplifier 204. In the second signal processing chain 600-2, each acoustic resonator 132-2 and 402-2 is coupled to a respective power amplifier 254. In alternative implementations, at least one antenna 122 may be coupled to a side that omits an acoustic resonator that can be configured into a serial acoustic resonator arrangement or a parallel acoustic resonator arrangement.

Figure 7:
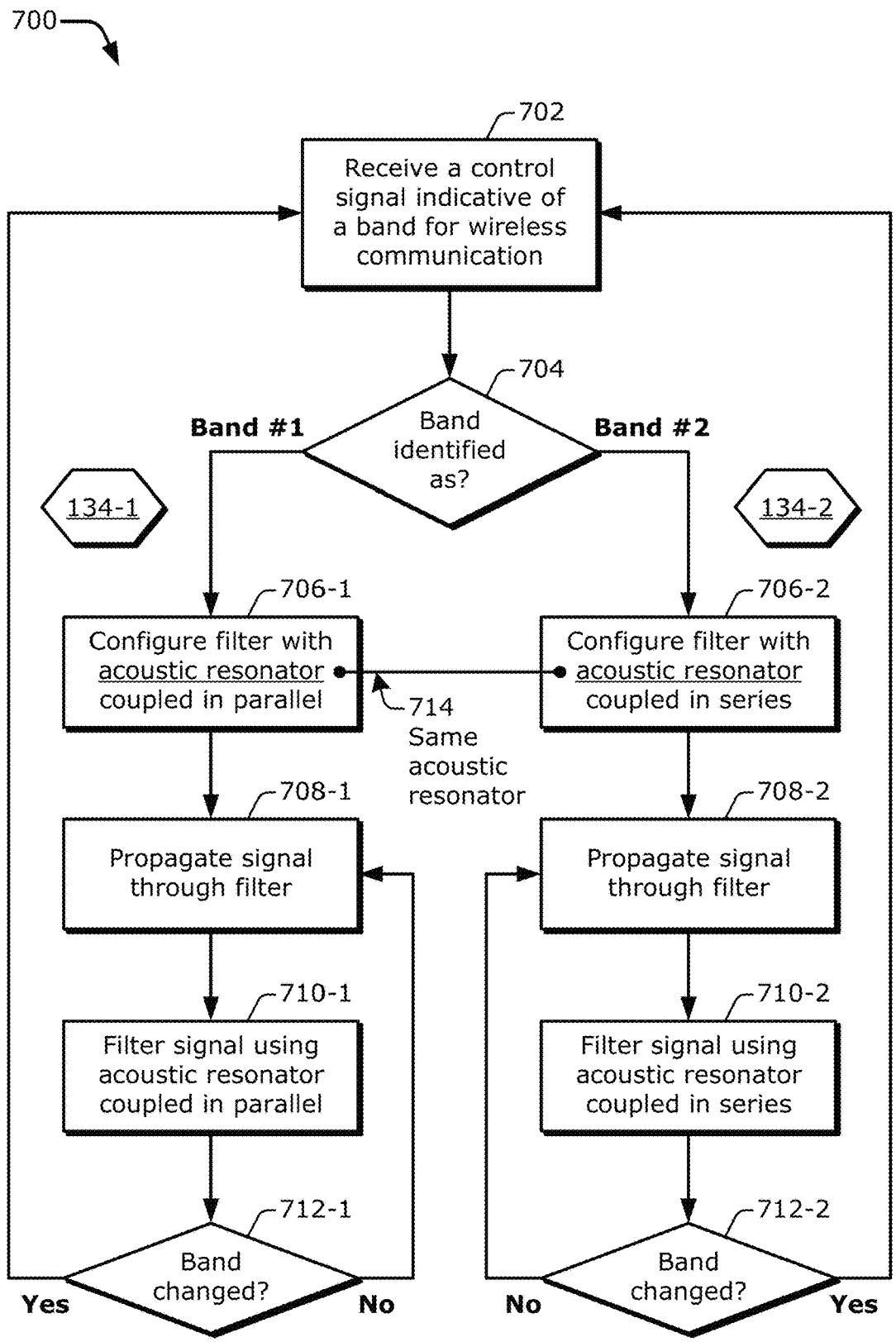
FIG. 7 is a flow diagram illustrating an example process for reconfiguring a reconfigurable filter.

FIGS. 7 and 8 are flow diagrams illustrating example processes or methods related to a reconfigurable filter. The processes are described in the form of a set of blocks that specify operations that can be performed. However, operations are not necessarily limited to the order shown in the figures or described herein, for the operations may be implemented in alternative orders or in fully or partially overlapping manners. Also, more, fewer, and/or different operations may be implemented to perform a respective process or an alternative process. Operations represented by the illustrated blocks of each process may be performed by an electronic device, such as the electronic device 102 of FIG. 1 or the wireless interface device 120 thereof. More specifically, the operations of the respective processes may be performed by a filter circuit 130 of a transceiver 126 or an RF front-end 128, independently or in conjunction with other components, such as a controller or an associated filter. Further, the operations of the respective FIGS. 7 and 8 may be combined or merged with each other to realize additional processes.

FIG. 7 is a flow diagram illustrating an example process 700 for reconfiguring a reconfigurable filter. The process 700 includes blocks 702 to 712-1 and 712-2 that specify operations that can be performed for one or more methods. At block 702, a control signal is received that is indicative of a band for wireless communication. A controller 350 can receive a control signal from a modem, with the control signal being, for instance, a digital control signal of at least one bit that is indicative that a current communication band is a first band (band #1) or a second band (band #2). At block 704, the controller 350 identifies the indicated communication band as the first band (e.g., band 12) or the second band (e.g., band 29).

Responsive to the control signal indicating the first band (band #1), the controller 350 causes the filter circuit 130 to enter the parallel mode 134-1. At block 706-1, the controller 350 configures (including reconfigures) the filter circuit 130 to place the acoustic resonator 132 to be coupled in parallel, such as in a shunt arrangement. At block 708-1, the filter circuit 130 propagates a signal 412-1 through the filter. At block 710-1, the filter circuit 130 filters the signal 412-1 using the acoustic resonator 132 that is coupled in a parallel manner.

At block 712-1, the controller 350 determines if the band has changed. If not, then the process 700 continues with additional signal propagation and filtering at blocks 708-1 and 710-1. If, on the other hand, the band has changed, then the process 700 continues with reception of the control signal, which can indicate the change of the communication band, at block 702 and a decision branch at block 704. The controller 350 may select from among multiple bands that number greater than two. In this part of the described example process flow; the control signal indicates the second band.

Responsive to the control signal indicating the second band (band #2), the controller 350 causes the filter circuit 130 to enter the serial mode 134-2. At block 706-2, the controller 350 configures (including reconfigures) the filter circuit 130 to place the acoustic resonator 132 to be coupled in series, which can enable the acoustic resonator 132 to carry the signal to or from the second filter port 302-2. As indicated at 714, the acoustic resonator 132 can be a same acoustic resonator for the parallel coupling thereof for one band in one mode (e.g., the parallel mode 134-1) and for the serial coupling thereof for another band in another mode (e.g., the serial mode 134-2), as described herein.

At block 708-2, the filter circuit 130 propagates another signal 412-2 through the filter. At block 710-2, the filter circuit 130 filters the other signal 412-2 using the acoustic resonator 132 that is coupled in a serial manner. Thus, the acoustic resonator 132 can pass at least a portion of the other signal 412-2 based on a resonant frequency of the acoustic resonator 132 and responsive to the frequencies included in the other signal 412-2. At block 712-2, the controller 350 determines if the band has changed. The process 700 continues with signal propagation and filtering (at blocks 708-2 and 710-2) or with a change of the configuration of the filter responsive to the control signal (at blocks 702, 704, . . . ) based on this determination.

FIG. 8 is a flow diagram illustrating an example process 800 for operating a reconfigurable filter. The process 800 includes blocks 802-808 that specify operations that can be performed for a method. At block 802, a signal propagates between a first filter port and a second filter port through an acoustic resonator that is connected to the second filter port in a serial acoustic resonator arrangement. For example, a filter circuit 130 can propagate a signal 412-2 between a first filter port 302-1 and a second filter port 302-2 through an acoustic resonator 132 that is connected to the second filter port 302-2 in a serial acoustic resonator arrangement (e.g., as shown in the serial mode 134-2 at FIGS. 3 and 4-2). The acoustic resonator 132 may have, for instance, a resonant frequency that enables the acoustic resonator 132 to pass frequencies relative to a first frequency band of a first mode.

At block 804, the acoustic resonator is disconnected from the second filter port. For example, the filter circuit 130 can disconnect the acoustic resonator 132 from the second filter port 302-2. In some cases, a switch 404 can remove a signal path between the acoustic resonator 132 and the second filter port 302-2 (e.g., by removing a path between a first terminal 408-1 and a third terminal 408-3 of the switch 404). To do so, at least one transistor of the switch 404 may be turned off to open that corresponding part of the switch 404.

At block 806, the acoustic resonator is connected to a ground in a parallel acoustic resonator arrangement. For example, the filter circuit 130 can connect the acoustic resonator 132 to a ground 306 in a parallel acoustic resonator arrangement (e.g., as shown in the parallel mode 134-1 at FIGS. 3 and 4-1). To create a shunt signal path, the switch 404 can create a signal path between the acoustic resonator 132 and the ground 306 (e.g., by establishing a path between the first terminal 408-1 and a second terminal 408-2 of the switch 404). To do so, at least one transistor of the switch 404 may be turned on to close that corresponding part of the switch 404.

At block 808, another signal is propagated between the first filter port and the second filter port across the acoustic resonator that is connected to the ground. For example, the filter circuit 130 can propagate another signal 412-1 between the first filter port 302-1 and the second filter port 302-2 across the acoustic resonator 132 that is connected to the ground 306. Here, the filter circuit 130 may route the other signal 412-1 to a first terminal 308-1 of the acoustic resonator 132 and then permit the other signal 412-1 to be shunted to the ground 306 via the second terminal 308-2 of the acoustic resonator 132 to suppress frequencies relative to a second frequency band of a second mode.

Figure 9:
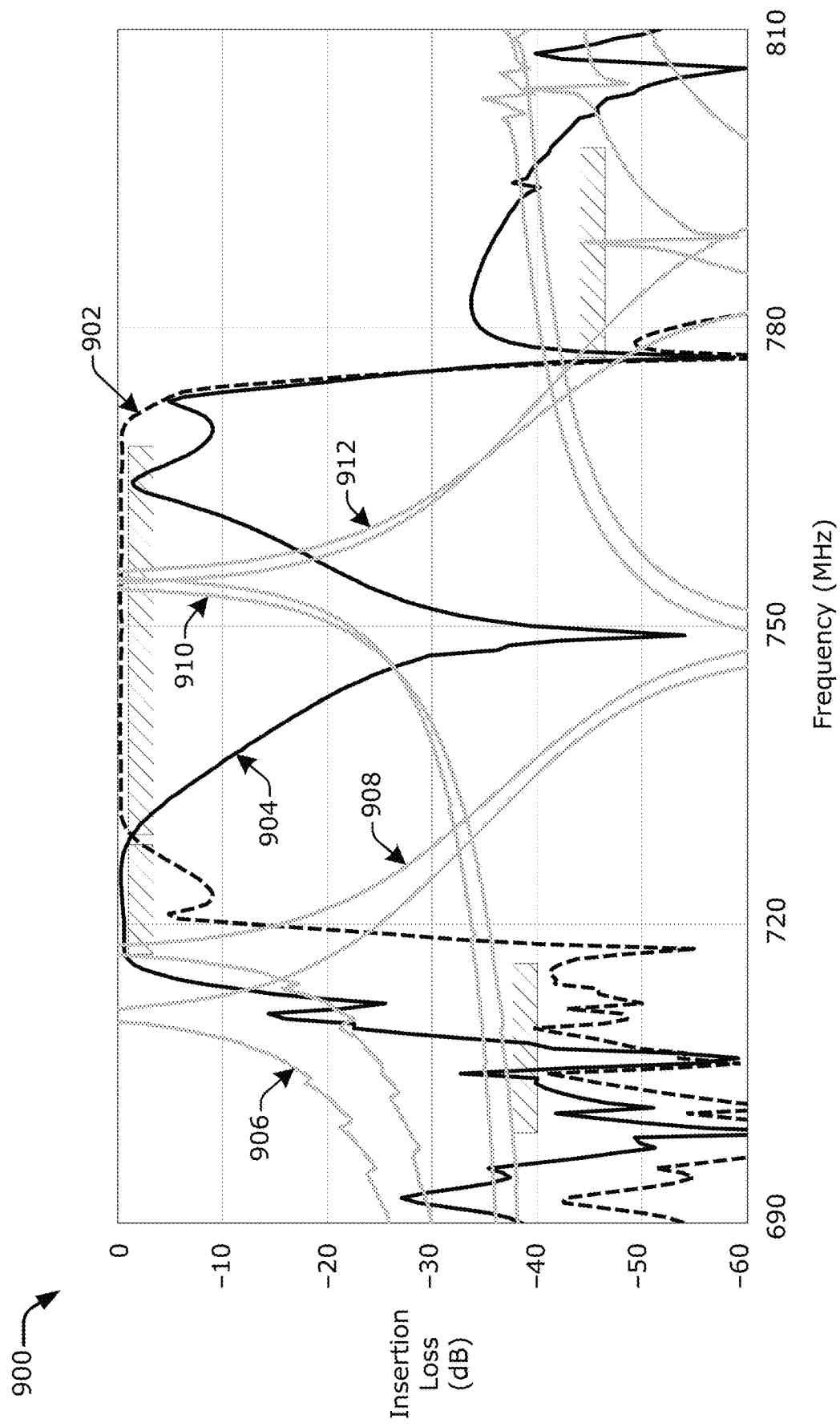
FIG. 9 is a graph depicting insertion loss versus frequency and illustrating example frequency response curves for acoustic resonators targeting example bands.

FIG. 9 is a graph 900 depicting insertion loss (dB) versus frequency (MHz) and illustrating example frequency response curves 902-912 for a filter with acoustic resonators targeting example bands. The example targeted bands correspond to the downlink (e.g., receiving for a user equipment) for bands 12, 13, and 14 and the downlink for band 29. The downlink frequencies for bands 12-14 span approximately 729-768 MHz, which is adjacent to the downlink frequency range for band 29, which is 717-728 MHz. Further, the downlink frequency range of band 29 (717-728 MHZ) is located proximate to, and between, the uplink and downlink frequency ranges of band 12 (699-716 and 729-746 MHZ, respectively).

Along the ordinate axis (y axis), the illustrated insertion loss ranges from 0 dB down to −60 dB in intervals of 10 dB. Along the abscissa axis (x axis), the depicted frequency ranges from 690 MHz up to 810 MHz with indications 30 MHz apart. Six frequency curves 902-912 are shown in the graph 900. These example curves can correspond to certain example implementations of the filter circuitry of FIG. 5. Two curves depict the transfer functions for the parallel mode 134-1 and the serial mode 134-2 (of FIG. 5). Four curves depict resonant frequencies for four respective acoustic resonators that are coupled to the filter core 502.

In the illustrated example of the graph 900, a response curve 902 is formed from a dark dashed line and depicts a transfer function for the parallel mode 134-1. This parallel mode 134-1 corresponds to wireless communication (e.g., wireless reception by a user equipment) in any of the bands 12, 13, or 14. Thus, a passband is provided approximately around the targeted frequencies of 729-768 MHz. A response curve 904 is formed from a dark solid line and depicts a transfer function for the serial mode 134-2. This serial mode 134-2 corresponds to wireless communication (e.g., wireless reception by a user equipment) in the band 29. Thus, a passband is provided approximately around the targeted frequencies of 717-728 MHz.

The graph 900 also depicts four response curves in solid gray lines for four acoustic resonators (e.g., the acoustic resonators 132-1, 132-2, 402-1, and 402-2 of FIG. 5) that illustrate respective resonant frequencies. A frequency response curve 906 corresponds to the first acoustic resonator 132-2, and a frequency response curve 908 corresponds to the third acoustic resonator 132-1. A frequency response curve 910 corresponds to the second acoustic resonator 402-2, and a frequency response curve 912 corresponds to the fourth acoustic resonator 402-1.

Thus, for the parallel mode 134-1 (of FIG. 5), the frequency curves 906 and 908 contribute as parallel acoustic resonators 132-2 and 132-1, respectively, to produce the transfer function of the curve 902. In the parallel mode 134-1, the curves 910 and 912 contribute as serial acoustic resonators to produce the transfer function of the curve 902. For the serial mode 134-2 (of FIG. 5), the curves 906 and 908 contribute as serial acoustic resonators 132-2 and 132-1, respectively, to produce the transfer function of the curve 904. In the serial mode 134-2, the curves 910 and 912 do not materially contribute to produce the transfer function of the curve 904 as the corresponding acoustic resonators 402-1 and 402-2 are connected to an open circuit.

This section describes some aspects of example implementations and/or example configurations related to the apparatuses and/or processes presented above.

Example aspect 1: An apparatus comprising:
a filter circuit comprising:
　a first filter port;
　a second filter port;
　a filter network comprising one or more acoustic resonators coupled between the first filter port and the second filter port;
　an acoustic resonator coupled to the filter network and coupled between the first filter port and the second filter port; and
　a switch circuit coupled between the acoustic resonator and the second filter port, the switch circuit configured to connect the acoustic resonator into a parallel acoustic resonator arrangement in a first state and connect the acoustic resonator into a serial acoustic resonator arrangement in a second state.

Example aspect 2: The apparatus of example aspect 1, wherein:
the filter circuit comprises a second acoustic resonator coupled to the filter network and coupled between the first filter port and the second filter port; and
the switch circuit is coupled between the second acoustic resonator and the second filter port, the switch circuit configured to connect the second acoustic resonator to the second filter port in the first state and disconnect the second acoustic resonator from the second filter port in the second state.

Example aspect 3: The apparatus of example aspect 1 or example aspect 2, wherein:
the acoustic resonator is configured to suppress frequencies relative to a first frequency band in the first state; and
the acoustic resonator is configured to pass frequencies relative to a second frequency band in the second state.

Example aspect 4: The apparatus of any one of the preceding example aspects, wherein the switch circuit is configured to connect the acoustic resonator to a ground in the first state and the acoustic resonator to the second filter port in the second state.

Example aspect 5: The apparatus of example aspect 4, wherein the switch circuit is configured to selectively connect:
the acoustic resonator to the ground based on a first frequency band: or
the acoustic resonator to the second filter port based on a second frequency band.

Example aspect 6: The apparatus of example aspect 5, wherein:
the first frequency band comprises band 12, band 13, or band 14; and
the second frequency band comprises band 29.

Example aspect 7: An apparatus comprising:
a filter circuit comprising:
　a first filter port:
　a second filter port:
　an acoustic resonator coupled to the first filter port; and
　a switch coupled between the acoustic resonator and a ground and between the acoustic resonator and the second filter port.

Example aspect 8: The apparatus of example aspect 7, wherein the switch is configured to selectively connect:
the acoustic resonator to the ground in a parallel resonator arrangement: or
the acoustic resonator to the second filter port in a serial resonator arrangement.

Example aspect 9: The apparatus of example aspect 8, wherein:
the acoustic resonator is configured to support a frequency suppression in the parallel resonator arrangement; and
the acoustic resonator is configured to support a frequency passband in the serial resonator arrangement.

Example aspect 10: The apparatus of any one of example aspects 7 to 9, wherein the filter circuit comprises:

a filter network coupled between the first filter port and the acoustic resonator.

Example aspect 11: The apparatus of example aspect 10, wherein:

the switch is coupled between the filter network and the second filter port; and the switch is configured to selectively connect or disconnect the second filter port from the filter network via a path that excludes the acoustic resonator.

Example aspect 12: The apparatus of example aspect 11, wherein the filter circuit comprises:

a second acoustic resonator coupled between the filter network and the switch along the path that excludes the acoustic resonator.

Example aspect 13: The apparatus of any one of example aspects 7 to 12, wherein:

the filter circuit is coupled between an antenna and a low-noise amplifier; and the low-noise amplifier is coupled to the filter circuit closer to the second filter port than to the first filter port.

Example aspect 14: The apparatus of any one of example aspects 7 to 13, wherein:

the filter circuit is coupled between an antenna and a power amplifier; and the power amplifier is coupled to the filter circuit closer to the second filter port than to the first filter port.

Example aspect 15: The apparatus of any one of example aspects 7 to 14, wherein:

the filter circuit is coupled between a component and an antenna; and the antenna is coupled to the filter circuit closer to the second filter port than to the first filter port.

Example aspect 16: The apparatus of any one of example aspects 7 to 15, wherein:

the filter circuit comprises:
 a filter core; and
 a second acoustic resonator coupled between the filter core and the switch; and the acoustic resonator is coupled between the filter core and the switch.

Example aspect 17: The apparatus of example aspect 16, wherein the filter core comprises an acoustic wave filter.

Example aspect 18: The apparatus of example aspect 17, wherein the acoustic wave filter comprises a dual-mode surface acoustic wave (SAW) (DMS) filter.

Example aspect 19: The apparatus of any one of example aspects 16 to 18, wherein the filter circuit comprises:

a third acoustic resonator coupled to the filter core:

a fourth acoustic resonator coupled to the filter core; and a second switch coupled between the first filter port and the third acoustic resonator and between the first filter port and the fourth acoustic resonator.

Example aspect 20: The apparatus of example aspect 19, wherein the second switch is configured to selectively connect:

the third acoustic resonator to the ground; or
the third acoustic resonator to the first filter port.

Example aspect 21: The apparatus of any one of example aspects 16 to 20, wherein the filter circuit is configured to selectively be in:

a first mode in which the switch is configured to:
 disconnect the acoustic resonator from the second filter port:
 connect the acoustic resonator to the ground; and
 connect the second acoustic resonator to the second filter port: or a second mode in which the switch is configured to:
 disconnect the acoustic resonator from the ground:
 connect the acoustic resonator to the second filter port; and
 disconnect the second acoustic resonator from the second filter port.

Example aspect 22: The apparatus of example aspect 21, wherein the filter circuit is configured to selectively be in:

the first mode responsive to wireless communication in accordance with a first frequency band: or the second mode responsive to wireless communication in accordance with a second frequency band.

Example aspect 23: The apparatus of any one of example aspects 7 to 22, further comprising:

at least one radio-frequency front-end comprising the filter circuit.

Example aspect 24: The apparatus of example aspect 23, further comprising:

a wireless interface device comprising the at least one radio-frequency front-end;

a display screen; and at least one processor operatively coupled to the display screen and at least a portion of the wireless interface device, the at least one processor configured to present one or more graphical images on the display screen based on one or more wireless signals communicated using the filter circuit of the wireless interface device.

Example aspect 25: An apparatus for filtering a signal, the apparatus comprising:

a filter circuit comprising:
 a first filter port:
 a second filter port:
 an acoustic resonator coupled between the first filter port and the second filter port; and
 means for switching the acoustic resonator to be selectively connected to a ground or to the second filter port.

Example aspect 26: The apparatus of example aspect 25, further comprising:

means for controlling the means for switching based on a first frequency band or a second frequency band, the first frequency band corresponding to the acoustic resonator being connected to the ground in a parallel resonator arrangement, and the second frequency band corresponding to the acoustic resonator being connected to the second filter port in a serial resonator arrangement.

Example aspect 27: The apparatus of example aspect 26, wherein:

the filter circuit comprises a second acoustic resonator coupled between the first filter port and the second filter port:

the means for switching comprises means for switching the second acoustic resonator to be selectively connected to the second filter port or an open circuit; and the means for controlling comprises means for controlling the means for switching based on the first frequency band or the second frequency band, the first frequency band corresponding to the second acoustic resonator being connected to the second filter port in a serial resonator arrangement, and the second frequency band corresponding to the second acoustic resonator being connected to the open circuit.

Example aspect 28: A method for filtering signals, the method comprising:

propagating a signal between a first filter port and a second filter port through an acoustic resonator that is connected to the second filter port in a serial acoustic resonator arrangement;

disconnecting the acoustic resonator from the second filter port:

connecting the acoustic resonator to a ground in a parallel acoustic resonator arrangement; and propagating another signal between the first filter port and the second filter port across the acoustic resonator that is connected to the ground.

Example aspect 29: The method of example aspect 28, further comprising:

performing the disconnecting and the connecting responsive to a change of a frequency band between the propagating of the signal and the propagating of the other signal.

Example aspect 30: The method of example aspect 28 or example aspect 29, further comprising:

connecting, after the propagating of the signal, a second acoustic resonator to the second filter port in the serial acoustic resonator arrangement, wherein the propagating of the other signal comprises propagating the other signal between the first filter port and the second filter port through the second acoustic resonator that is connected to the second filter port in the serial acoustic resonator arrangement.

As used herein, the terms "couple," "coupled," or "coupling" refer to a relationship between two or more components that are in operative communication with each other to implement some feature or realize some capability that is described herein. The coupling can be realized using, for instance, a physical line, such as a metal trace or wire, or an electromagnetic coupling, such as with a transformer. A coupling can include a direct coupling or an indirect coupling. A direct coupling refers to connecting discrete circuit elements via a same node without an intervening element. An indirect coupling refers to connecting discrete circuit elements via one or more other devices or other discrete circuit elements, including two or more different nodes.

The term "port" (e.g., including a "first port" or a "filter port") represents at least a point of electrical connection at or proximate to the input or output of a component or between two or more components (e.g., active or passive circuit elements or parts). Although at times a port may be visually depicted in a drawing as a single point (or a circle), the port can represent an inter-connected portion of a physical circuit or network that has at least approximately a same voltage potential at or along the portion. In other words, a port can represent at least one point (e.g., a node) of multiple points along a conducting medium (e.g., a wire or trace) that exists between electrically connected components. In some cases, a "port" can represent at least one node that represents or corresponds to an input or an output of a component, such as a filter or part thereof. Similarly, a "terminal" may represent one or more points with at least approximately a same voltage potential relative to an input or output of a component.

The terms "first," "second," "third," and other numeric-related indicators are used herein to identify or distinguish similar or analogous items from one another within a given context-such as a particular implementation, a single drawing figure, a given component, or a claim. Thus, a first item in one context may differ from a first item in another context. For example, an item identified as a "first port" in one context may be identified as a "second port" in another context. Similarly, a "first resonator" or a "first switch" in one claim may be recited as a "second resonator" or a "second switch," respectively, in a different claim.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). As used herein, a phrase referring to "at least one of" a list of items refers to any combination of those items, including single members. As an example, "at least one of a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c, or any other ordering of a, b, and c). Further, items represented in the accompanying figures and terms discussed herein may be indicative of one or more items or terms, and thus reference may be made interchangeably to single or plural forms of the items and terms in this written description. Finally, although subject matter has been described in language specific to structural features or methodological operations, it is to be understood that the subject matter defined in the appended claims is not necessarily limited to the specific features or operations described above, including not necessarily being limited to the organizations in which features are arranged or the orders in which operations are performed.

What is claimed is:

1. An apparatus comprising:
   a filter circuit comprising:
      a first filter port;
      a second filter port;
      a filter network comprising one or more acoustic resonators coupled between the first filter port and the second filter port;
      an acoustic resonator coupled to the filter network and coupled between the first filter port and the second filter port; and
      a switch circuit coupled between the acoustic resonator and the second filter port, the switch circuit configured to connect the acoustic resonator into a parallel acoustic resonator arrangement in a first state and connect the acoustic resonator into a serial acoustic resonator arrangement in a second state, wherein the switch circuit is configured to connect the acoustic resonator to a ground in the first state and the acoustic resonator to the second filter port in the second state, wherein the switch circuit is configured to selectively connect:
         the acoustic resonator to the ground based on a first frequency band; or
         the acoustic resonator to the second filter port based on a second frequency band.

2. The apparatus of claim 1, wherein:
   the filter circuit comprises a second acoustic resonator coupled to the filter network and coupled between the first filter port and the second filter port; and
   the switch circuit is coupled between the second acoustic resonator and the second filter port, the switch circuit configured to connect the second acoustic resonator to the second filter port in the first state and disconnect the second acoustic resonator from the second filter port in the second state.

3. The apparatus of claim 1, wherein:
   the acoustic resonator is configured to suppress frequencies relative to the first frequency band in the first state; and the acoustic resonator is configured to pass frequencies relative to the second frequency band in the second state.

4. The apparatus of claim 1, wherein:
the first frequency band comprises band 12, band 13, or band 14; and
the second frequency band comprises band 29.

5. An apparatus comprising:
a filter circuit comprising:
a first filter port;
a second filter port;
an acoustic resonator coupled to the first filter port;
a switch coupled between the acoustic resonator and a ground and between the acoustic resonator and the second filter port;
a filter core; and
a second acoustic resonator coupled between the filter core and the switch, wherein the acoustic resonator is coupled between the filter core and the switch.

6. The apparatus of claim 5, wherein the switch is configured to selectively connect:
the acoustic resonator to the ground in a parallel resonator arrangement; or
the acoustic resonator to the second filter port in a serial resonator arrangement.

7. The apparatus of claim 6, wherein:
the acoustic resonator is configured to support a frequency suppression in the parallel resonator arrangement; and
the acoustic resonator is configured to support a frequency passband in the serial resonator arrangement.

8. The apparatus of claim 5, wherein:
the filter circuit is coupled between an antenna and a low-noise amplifier; and
the low-noise amplifier is coupled to the filter circuit closer to the second filter port than to the first filter port.

9. The apparatus of claim 5, wherein:
the filter circuit is coupled between an antenna and a power amplifier; and
the power amplifier is coupled to the filter circuit closer to the second filter port than to the first filter port.

10. The apparatus of claim 5, wherein:
the filter circuit is coupled between a component and an antenna; and
the antenna is coupled to the filter circuit closer to the second filter port than to the first filter port.

11. The apparatus of claim 5, wherein the filter core comprises an acoustic wave filter.

12. The apparatus of claim 11, wherein the acoustic wave filter comprises a dual-mode surface acoustic wave (SAW) (DMS) filter.

13. The apparatus of claim 5, wherein the filter circuit comprises:
a third acoustic resonator coupled to the filter core;
a fourth acoustic resonator coupled to the filter core; and
a second switch coupled between the first filter port and the third acoustic resonator and between the first filter port and the fourth acoustic resonator.

14. The apparatus of claim 13, wherein the second switch is configured to selectively connect:
the third acoustic resonator to the ground; or
the third acoustic resonator to the first filter port.

15. The apparatus of claim 5, wherein the filter circuit is configured to selectively be in:
a first mode in which the switch is configured to:
disconnect the acoustic resonator from the second filter port;
connect the acoustic resonator to the ground; and
connect the second acoustic resonator to the second filter port; or
a second mode in which the switch is configured to:
disconnect the acoustic resonator from the ground;
connect the acoustic resonator to the second filter port; and
disconnect the second acoustic resonator from the second filter port.

16. The apparatus of claim 15, wherein the filter circuit is configured to selectively be in:
the first mode responsive to wireless communication in accordance with a first frequency band; or
the second mode responsive to wireless communication in accordance with a second frequency band.

17. The apparatus of claim 5, further comprising:
at least one radio-frequency front-end comprising the filter circuit.

18. The apparatus of claim 17, further comprising:
a wireless interface device comprising the at least one radio-frequency front-end;
a display screen; and
at least one processor operatively coupled to the display screen and at least a portion of the wireless interface device, the at least one processor configured to present one or more graphical images on the display screen based on one or more wireless signals communicated using the filter circuit of the wireless interface device.

19. An apparatus for filtering a signal, the apparatus comprising:
a filter circuit comprising:
a first filter port;
a second filter port;
an acoustic resonator coupled between the first filter port and the second filter port;
means for switching the acoustic resonator to be selectively connected to a ground or to the second filter port; and
means for controlling the means for switching based on a first frequency band or a second frequency band, the first frequency band corresponding to the acoustic resonator being connected to the ground in a parallel resonator arrangement, and the second frequency band corresponding to the acoustic resonator being connected to the second filter port in a serial resonator arrangement, wherein:
the filter circuit comprises a second acoustic resonator coupled between the first filter port and the second filter port;
the means for switching comprises means for switching the second acoustic resonator to be selectively connected to the second filter port or an open circuit; and
the means for controlling comprises means for controlling the means for switching based on the first frequency band or the second frequency band, the first frequency band corresponding to the second acoustic resonator being connected to the second filter port in a serial resonator arrangement, and the second frequency band corresponding to the second acoustic resonator being connected to the open circuit.

20. An apparatus comprising:
a filter circuit comprising:
a first filter port;
a second filter port;
an acoustic resonator coupled to the first filter port;

a switch coupled between the acoustic resonator and a ground and between the acoustic resonator and the second filter port; and a filter network coupled between the first filter port and the acoustic resonator, wherein:

the switch is coupled between the filter network and the second filter port; and the switch is configured to selectively connect or disconnect the second filter port from the filter network via a path that excludes the acoustic resonator.

21. The apparatus of claim 20, wherein the filter circuit comprises:

a second acoustic resonator coupled between the filter network and the switch along the path that excludes the acoustic resonator.

22. An apparatus comprising:

a filter circuit comprising:

a first filter port;

a second filter port;

a filter network comprising one or more acoustic resonators coupled between the first filter port and the second filter port;

an acoustic resonator coupled to the filter network and coupled between the first filter port and the second filter port; and a switch circuit coupled between the acoustic resonator and the second filter port, the switch circuit configured to connect the acoustic resonator into a parallel acoustic resonator arrangement in a first state and connect the acoustic resonator into a serial acoustic resonator arrangement in a second state, wherein:

the filter circuit comprises a second acoustic resonator coupled to the filter network and coupled between the first filter port and the second filter port; and the switch circuit is coupled between the second acoustic resonator and the second filter port, the switch circuit configured to connect the second acoustic resonator to the second filter port in the first state and disconnect the second acoustic resonator from the second filter port in the second state.

* * * * *